United States Patent
Sasaoka et al.

(12) 
(10) Patent No.: US 6,730,840 B2
(45) Date of Patent: May 4, 2004

(54) CONCENTRATING PHOTOVOLTAIC MODULE AND CONCENTRATING PHOTOVOLTAIC POWER GENERATING SYSTEM

(75) Inventors: Makoto Sasaoka, Kyoto (JP); Tatsuo Fujisaki, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 10/098,366

(22) Filed: Mar. 18, 2002

(65) Prior Publication Data

US 2002/0148497 A1 Oct. 17, 2002

(30) Foreign Application Priority Data

Mar. 23, 2001  (JP) ........................................ 2001-084718

(51) Int. Cl.⁷ ............................................. H01L 31/052
(52) U.S. Cl. ...................... 136/246; 136/259; 136/291; 257/432; 257/433; 250/203.4; 250/216; 60/641.8
(58) Field of Search ................ 136/246, 259, 136/291; 257/432, 433; 250/203.4, 216; 60/641.8

(56) References Cited

U.S. PATENT DOCUMENTS

| | | | | |
|---|---|---|---|---|
| 4,461,278 A | * | 7/1984 | Mori ........................ 126/700 |
| 4,511,755 A | | 4/1985 | Mori ........................ 136/246 |
| 4,529,830 A | * | 7/1985 | Daniel ....................... 136/246 |
| 4,798,444 A | | 1/1989 | McLean ..................... 136/246 |
| 5,089,055 A | * | 2/1992 | Nakamura .................. 136/248 |
| 5,460,659 A | * | 10/1995 | Krut ......................... 136/246 |
| 5,500,054 A | * | 3/1996 | Goldstein .................. 136/253 |
| 5,560,700 A | * | 10/1996 | Levens ....................... 362/32 |
| 5,575,860 A | * | 11/1996 | Cherney .................... 136/245 |
| 5,716,442 A | * | 2/1998 | Fertig ....................... 136/246 |
| 6,541,694 B2 | * | 4/2003 | Winston et al. ............. 136/246 |

FOREIGN PATENT DOCUMENTS

| | | | |
|---|---|---|---|
| JP | 56-5505 A | * | 1/1981 |
| JP | 7-231111 | | 8/1995 |
| JP | 10-150215 A | * | 6/1998 |

OTHER PUBLICATIONS

"Basic Photovoltaic Principles and Methods," Solar Energy Research Institute, pp. 160–163, (1984).*

* cited by examiner

*Primary Examiner*—Alan Diamond
(74) *Attorney, Agent, or Firm*—Fitzpatrick, Cella, Harper & Scinto

(57) ABSTRACT

A concentrating photovoltaic module comprising: a lightguide member having at least one exit face and a plurality of entrance faces; and at least one solar cell placed immediately after the exit face of the lightguide member; wherein the lightguide member is comprised of a light transmissive, solid medium having no refractive-index-discontinuity portion and a surface of the lightguide member is smooth and wherein the lightguide member makes sunbeams incident on the plurality of entrance faces, totally reflected on side faces, and emergent from the exit face, whereby the sunbeams can be concentrated on the solar cell with high efficiency.

21 Claims, 17 Drawing Sheets

CONCENTRATING PHOTOVOLTAIC MODULE AND CONCENTRATING PHOTOVOLTAIC POWER GENERATING SYSTEM

BACKGROUND OF THE INVENTION

1. Field of the Invention

The present invention relates to a concentrating photovoltaic module and a concentrating photovoltaic power generating system.

2. Related Background Art

Attention has been focused heretofore on the photovoltaic power generating systems utilizing the solar cell modules as an energy source being safe for and no strain on the environment, but emphasis is recently being shifted to development of inexpensive solar cell modules with higher efficiency, in order to make them competitive over the conventional power generating means such as the thermal power generation and others even from the economical aspect.

From this respect, attention is recently being given to a concentrating photovoltaic module and a concentrating photovoltaic power generating system consisting of the concentrating photovoltaic module and a sun tracking device. In the ordinary photovoltaic power generating systems the solar cell module itself is fixed at a certain position, but the relation between Sun and Earth varies with time as a matter of course. Therefore, the fixed solar cell module can be located at the best angle relative to the sun only for a moment, and can be said to receive the solar energy at inappropriate angles during other periods of time. This can not apply only to directions of the sun (so called hour angles) from the solar cell module side but also to seasonal change of the sun route (declination change). In addition, the reflectance on the surface of the solar cell module also increases as the angle of incidence of sunbeams deviates from a normal to the solar cell module. The light receiving angle of the solar cell module is thus also inappropriate in this respect, which causes loss. Such loss is considered to sum up even to 20 to 30% of the energy to be received otherwise.

In order to eliminate the inappropriateness of the light receiving angle, the solar cell module needs to be always maintained at the best angle to the sun. This idea leads to a scheme of the photovoltaic power generating system of a sun tracking type and the tracking of the sun is expected to increase the electric power generated per year by 25% to 40%.

The concentrating photovoltaic power generating systems of the sun tracking type are also under research similarly toward reduction of unit cost of power generation. Since the concentrating photovoltaic power generating systems allow great saving of solar cells, which are most expensive among the components of the concentrating photovoltaic modules constituting the photovoltaic power generating systems, it becomes feasible to implement extremely great cost reduction.

As generally mentioned, generated voltage increases with increase in light intensity, so as to increase the rate of output energy to input energy, i.e., conversion efficiency. This results in yielding a greater output when compared with a configuration wherein solar cells are spread over the same area.

In order to draw this effect satisfactorily, it is necessary to construct the concentrating photovoltaic power generating system capable of concentrating light at a high magnification. This system requires the concentrating photovoltaic module having an optical system for efficiently concentrating the sunbeams.

A conventional means for concentrating the sunbeams is one as shown in FIG. 17 wherein a solar cell 204 is located at a position approximately coincident with the focal length of Fresnel lens 201 and parallel to the Fresnel lens 201, so as to concentrate sunbeams 107 impinging on the Fresnel lens 201, onto the solar cell 204.

In this method, however, spherical aberration, chromatic aberration, etc. of the Fresnel lens 201 makes it harder to concentrate the sunbeams 107 at a point with decrease in the F-number (=focal length÷aperture) of the Fresnel lens 201, which decreases light concentration efficiency. As a result, the focal length of the Fresnel lens 201 was not allowed to be decreased much. For this reason, the conventional concentrating photovoltaic modules increased their thickness, weight, and cost as compared with the flat panel type solar cell modules, and the tracking device for making the concentrating photovoltaic module track the sun also had to be constructed in large scale in consideration of tracking performance, wind endurance, and so on.

Taking the above into consideration, Japanese Patent Application Laid-Open No. 7-231111 suggests an example in which the entire module is compactified by subdividing (or downsizing) a concentrating lens. This is the example in which both the concentrating optical elements and solar cells are reduced to shorten the focal length while maintaining the F-number, as against the conventional concentrating photovoltaic modules. In this example, however, the number of solar cells increased with decrease of the size, so as to raise problems of decrease in efficiency due to a voltage drop in a series configuration of the solar cells, and increase of manufacturing cost.

U.S. Pat. No. 5,089,055 suggests an example in which a plurality of concentrating optical elements and a plurality of optical fibers are used to guide the sunbeams onto one solar cell. However, when exit faces of the optical fibers were directly arrayed in front of the solar cell, unevenness in quantity of light (hereinafter referred to as "light quantity unevenness") among the individual optical fibers directly resulted in light quantity unevenness on the solar cell, which reduced the efficiency of the solar cell. In order to eliminate the light quantity unevenness in the individual optical fibers, it was necessary to use sufficiently long optical fibers. Since the permissible angle range of incidence of sunbeams was narrow on the input faces of the optical fibers, it was necessary to increase the F-number of the concentrating optical elements.

The expression "light quantity unevenness on a solar cell" as herein employed is intended to mean a state such that portions with strong light and portions with weak light are generated on the solar cell, which results in that the portions with strong light and the portions with weak light have optimal operating points different from each other, whereby the optimal operating point is shifted. Thus, there are cases where the shifted optimal operating point may be a value lower than an optimal operating voltage to be obtained with uniform light quantity, thereby lowering the conversion efficiency. Further, there are also cases where the light quantity unevenness may cause partial temperature rise to break the solar cell.

The above U.S. patent also describes an example wherein the plurality of optical fibers are once guided to a tubular light pipe, the sunbeams are mixed by making use of internal reflection inside the light pipe, and the mixed light is guided to the solar cell. However, since the light pipe has a different refractive index from that of the optical fibers, reflection loss occurs at the interface between them. There also occurs transmission loss, because the sunbeams are transmitted through the reflection inside the light pipe. Namely, aluminum or silver commonly used as a reflecting material of internal reflectors has the reflectance of 85 to 95% (in the visible region). While the sunbeams are guided to the solar cell through several reflections on the internal reflector, the energy of sunbeams decreases every reflection on the internal reflector, which posed a problem that the sunbeams were unable to be efficiently guided to the solar cell. It was also necessary to take deterioration of the reflecting material or the like into consideration.

The spherical aberration and chromatic aberration of the aforementioned Fresnel lens 201 hindered uniform irradiation of the solar cell 204 with the concentrated sunbeams 107 to cause degradation of efficiency of the solar cell 204 and increase of temperature at only local areas in certain cases, which resulted in damaging the solar cell 204. When the solar cell 204 was of multiple junction structure (in which a plurality of pn junctions made of several different materials were stacked in the traveling direction of light), the chromatic aberration caused dispersion of spectral distribution on the solar cell 204, resulting in greatly decreasing the conversion efficiency of the solar cell 204.

The expression "dispersion of spectral distribution" as herein employed is intended to mean one caused by chromatic aberration or the like, specifically a state such that dispersion depending on locations is generated in spectral distribution on a solar cell, thereby generating locations with more light of longer wavelengths or locations with more light of shorter wavelengths as compared to ordinary spectral distribution.

Since the Fresnel lenses generally used had the merits of smaller thickness, lighter weight, and lower cost than spherical (or aspherical) lenses having the same focal length, they have commonly been used, but they had lower concentration efficiencies than the spherical lenses, because a spherical surface (or an aspherical surface) was approximated by an uneven surface.

Each of a Fresnel lens with an uneven surface on the photoreceptive surface side (which will be referred to hereinafter as a front convex Fresnel lens) and a Fresnel lens with an uneven surface on the opposite side to the photoreceptive surface (which will be referred to hereinafter as a back convex Fresnel lens) had both merits and demerits, but they both were inferior to the spherical lenses (aspherical lenses).

Namely, while it was preferable to use the front convex Fresnel lens with small coma (a characteristic capable of guiding even sunbeams off the normal direction to the Fresnel lens to the solar cell) in consideration of relief of tracking accuracy of the tracking device, relief of forming accuracy of the concentrating photovoltaic module, utilization of circumsolar radiation, etc., dust was easier to build up on the photoreceptive surface and reflection loss occurred at uneven portions without provision of a sufficient focal length in the case of the front convex Fresnel lens, as compared with the back convex Fresnel lens.

Neither of the above-stated methods succeeded in efficiently concentrating the sunbeams on the solar cell without light quantity unevenness and dispersion of spectral distribution (hereinafter referred to as "spectral distribution dispersion") and, particularly, in providing a compact and inexpensive concentrating photovoltaic module.

SUMMARY OF THE INVENTION

An object of the present invention is to concentrate the sunbeams on the solar cell without light quantity unevenness and spectral distribution dispersion and with high efficiency. Another object of the invention is to provide a compact, lightweight, inexpensive concentrating photovoltaic module, and a concentrating photovoltaic power generating system comprising the concentrating photovoltaic module and a tracking device.

The present invention was accomplished on the basis of the above-discussed recognition.

A concentrating photovoltaic module according to the present invention is a concentrating photovoltaic module comprising: a lightguide member having at least one exit face and a plurality of entrance faces; and at least one solar cell positioned immediately after the exit face of the lightguide member; wherein the lightguide member is comprised of a light transmissive, solid medium having no refractive-index-discontinuity portion and a surface of the lightguide member is smooth, and wherein the lightguide member makes sunbeams incident on the plurality of entrance faces, totally reflected on side faces, and emergent from the exit face. This allows the sunbeams with different characteristics (light quantity and spectral distributions) incident on all the entrance faces in the concentrating photovoltaic module to be combined and to be guided in a reduced state of light quantity unevenness and spectral distribution dispersion to the solar cell with high efficiency.

Namely, the sunbeams with different characteristics incident from all the entrance faces of the lightguide member each are repeatedly totally reflected on the smooth side faces of the lightguide member to be mixed, and thereafter they are together mixed in the same area inside the lightguide member. It is thus feasible to guide the sunbeams in the reduced state of light quantity unevenness and spectral distribution dispersion to the solar cell and thus to prevent the degradation of efficiency of the solar cell due to the light quantity unevenness and spectral distribution dispersion. The expression "having no refractive-index-discontinuity portion" stated herein refers to the refractive index being almost single; specifically, dispersion is preferably within 1% and more preferably within 0.5%. More preferably, it refers to the refractive index being single (though inevitable dispersion in fabrication is permitted).

Other features and effects of the present invention will be described below in detail with reference to the drawings.

BRIEF DESCRIPTION OF THE DRAWINGS

FIGS. 1A, 1B and 1C are views illustrating the first example of the present invention, wherein FIG. 1A is a perspective view showing an external view of a concentrating photovoltaic power generating system, FIG. 1B a sectional view of a concentrating photovoltaic module shown in FIG. 1A, and FIG. 1C an enlarged view of part A in the concentrating photovoltaic module shown in FIG. 1B;

FIGS. 6A, 6B and 6C are views illustrating the third example of the present invention, wherein FIG. 6A is a sectional view of a concentrating photovoltaic module, FIG. 6B an enlarged view of part C in the concentrating photovoltaic module shown in FIG. 6A, and FIG. 6C shows the structure of a region near the solar cell;

FIGS. 7A and 7B are views illustrating the third example of the present invention, wherein FIG. 7A is a perspective view showing the structure of the concentrating photovoltaic module and FIG. 7B shows paths of incidence of sunbeams in the case where solar radiation is made incident to the concentrating photovoltaic module shown in FIG. 7A;

FIGS. 16A, 16B and 16C are views illustrating change of optical path lengths due to differences in the shape of the lightguide member, wherein FIG. 16A shows a case of concentration in the first half of the lightguide member (wherein the optical path lengths of sunbeams are longest), FIG. 16B shows a case of concentration in the whole of the lightguide member, and FIG. 16C shows a case of concentration in the second half of the lightguide member (wherein the optical path lengths of sunbeams are shortest)

Like features in the respective FIGURES are indicated with like numerals.

DESCRIPTION OF THE PREFERRED EMBODIMENTS

Figure 1A:
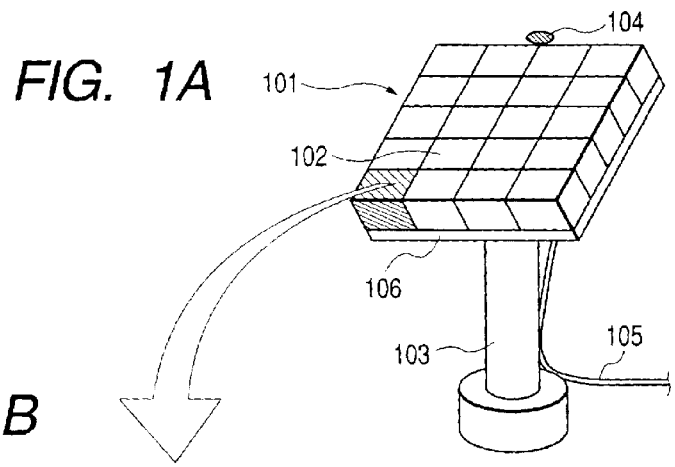

A concentrating photovoltaic module according to the present invention is a concentrating photovoltaic module comprising: a lightguide member having at least one exit face and a plurality of entrance faces; and at least one solar cell positioned immediately after the exit face of the lightguide member; wherein the lightguide member is comprised of a light transmissive, solid medium having no refractive-index-discontinuity portion and a surface of the lightguide member is smooth, and wherein the lightguide member makes sunbeams incident on the plurality of entrance faces, totally reflected on side faces, and emergent from the exit face.

A concentrating photovoltaic power generating system according to the present invention comprises the concentrating photovoltaic module and a tracking device.

Since the lightguide member is comprised of the medium having no refractive-index-discontinuity portion, the total reflection of sunbeams occurs because of the index difference between the lightguide member and air and the critical angle is smaller than in the case of the optical fibers and others. Therefore, the sunbeams can be mixed by the lightguide member of shorter length whereby the concentrating photovoltaic module can be largely downsized.

Namely, if the lightguide member in the concentrating photovoltaic module of the present invention were replaced by optical fibers, a considerably long length of the optical fibers would be necessary for guiding the sunbeams in the reduced state of light quantity unevenness and spectral distribution dispersion to the solar cell and the concentrating photovoltaic module would become larger in size as a result. If a plurality of optical fibers were combined into a single optical fiber, the structure of the pertinent part would become complex and expensive, so as to pose a problem in cost.

Since the present invention increases the permissible incidence angle range of the entrance faces of the lightguide member, it results in relieving the tracking accuracy of the tracking device, relieving the forming accuracy of the concentrating photovoltaic module, making effective use of the circumsolar radiation, etc., thereby increasing the power generation efficiency of the concentrating photovoltaic module.

Incidentally, it is preferred that the lightguide member makes sunbeams totally incident on the entrance faces. The term "totally incident" stated herein refers to a state of incidence ignoring aberration of concentrating optical elements, reflection at the interface between the concentrating optical elements and air, and reflection at the interface between the lightguide member and air, and in practice, it refers to a state of incidence in which approximately 90% of the sunbeams contributing to power generation of the solar cell are incident on the entrance faces.

Further, it is preferable in the present invention to employ a structure wherein the module has a concentrating optical element group comprising a plurality of concentrating optical elements being in a pair with the entrance faces and functioning to concentrate the sunbeams from the sun in the vicinity of the entrance faces and wherein the sunbeams concentrated by the concentrating optical elements are made incident on the entrance faces of the lightguide member, totally reflected on the side faces, and emergent from the exit face. This structure permits more sunbeams to be guided to the entrance faces of the lightguide member, so that it becomes feasible to provide the concentrating photovoltaic module with higher concentration factor.

When the sunbeams are concentrated by the plurality of concentrating optical elements for one solar cell, the size of the concentrating optical elements becomes smaller and the focal length becomes shorter where the concentrating optical elements having the same F-number as that of the conventional concentrating photovoltaic modules are used. It is thus feasible to reduce the size of the concentrating photovoltaic module greatly. The size of each concentrating optical element becomes far smaller than that in the conventional concentrating photovoltaic modules (in the structure of one concentrating optical element for one solar cell), so that it becomes feasible to use planoconvex lenses, which were not allowed to use in the conventional concentrating photovoltaic modules in terms of weight, cost, size, and formability. This can achieve enhancement of the power generation efficiency of the concentrating photovoltaic module.

It is also preferable to employ a configuration wherein the lightguide member is comprised of a uniform medium. This permits the lightguide member to be formed by integral molding or the like, thereby decreasing the cost. Since coefficients of linear expansion are uniform in the lightguide member, the lightguide member becomes more resistant to mechanical influence due to temperature difference.

It is also preferable to employ a structure wherein the lightguide member consists of a trunk and a plurality of branches extending from the trunk, the lightguide member has the exit face at the root of the trunk and the entrance faces at distal ends of the branches, and the sunbeams incident on the entrance faces are mixed in the branches and the trunk and thereafter guided to the solar cell. This can achieve further reduction of the size of the concentrating photovoltaic module, because the lightguide member can be constructed in various layouts making effective use of the interior of the three-dimensional space inside the concentrating photovoltaic module.

A shape of the lightguide member is preferably a shape not hindering the total reflection of the sunbeams traveling to the solar cell inside the lightguide member. This permits the sunbeams incident on the entrance faces of the lightguide member to be guided to the exit face with high efficiency.

A shape of the exit face of the lightguide member is preferably substantially the same as that of the solar cell. This permits the sunbeams emerging from the exit face of the lightguide member to be guided to the solar cell efficiently.

It is also preferable to employ a configuration wherein the solar cell is mounted parallel to the exit face. This permits the sunbeams emerging from the exit face of the lightguide member to be guided to the solar cell most efficiently.

A shape of the lightguide member immediately before the exit face is preferably a tapered shape toward the exit face. This permits the sunbeams to be concentrated in a state of the shortest path lengths in the lightguide member, which can decrease the energy loss due to the internal transmittance inside the lightguide member.

A sectional shape of the trunk or the branches of the lightguide member is preferably rectangular. This permits the lightguide member to be excellent in mixing of sunbeams, formability, designing of merge shape of the branches, and designing of merge shape of the branches and trunk.

Each concentrating optical element is preferably a planoconvex lens with a convex surface on the photoreceptive side. This increases the optical efficiency of the concentrating optical elements and decreases the spherical aberration and coma, so as to expand the permissible incidence angle range of the concentrating photovoltaic module (relieve the tracking accuracy of the tracking device, relieve the forming accuracy of the concentrating photovoltaic module, make effective use of the circumsolar radiation, etc.), resulting in achieving enhancement of the power generation efficiency of the concentrating photovoltaic module.

The planoconvex lens is preferably one having an aspherical surface. This eliminates the spherical aberration of the concentrating optical elements and thus can further enhance the power generation efficiency of the concentrating photovoltaic module.

It is also preferable to employ a structure wherein each entrance face of the lightguide member is a spherical surface or an aspherical surface being convex on the photoreceptive surface side. This permits even the sunbeams arriving with deviation at the entrance faces of the lightguide member to be also guided into the lightguide member. Namely, even if the sunbeams arrive with deviation at the entrance faces of the lightguide member because of the aberration of the concentrating optical elements, tracking errors of the tracking device, or forming errors of the concentrating photovoltaic module, they can be again concentrated on the entrance faces of the lightguide member by the concentrating effect of the entrance faces of the lightguide member. Further, it also becomes feasible to guide the circumsolar radiation to the solar cell as well and, in turn, increase the power generation efficiency of the concentrating photovoltaic module.

It is preferable to employ a structure wherein each concentrating optical element is an optical system having a focal point near the entrance face of the lightguide member and the lightguide member is held near the focal point. In this structure, there is an area in which the total reflection of sunbeams does not occur on each side face of the lightguide member near the focal point and the lightguide member can be held at that area whereby the lightguide member can be firmly held only at that position without hindering the total reflection of sunbeams inside the lightguide member.

Namely, if the lightguide member were held at portions where the total reflection of sunbeams occurs on the side faces of the lightguide member, the total reflection would not occur there, so as to cause energy loss.

It is also preferable to employ a structure wherein the concentrating optical element group is made by integral molding. This permits the concentrating optical element group to be produced at low cost, and also permits the optical axes of all the concentrating optical elements to be aligned at a time in assembly of the concentrating photovoltaic module.

It is also preferable to employ a structure wherein the lightguide member is made by integral molding. This permits the lightguide member to be produced at low cost and also permits the optical axes of all the concentrating optical elements to be aligned at a time in assembly of the concentrating photovoltaic module.

It is also preferable to employ a structure wherein the concentrating optical element group and the lightguide member are made by integral molding. This permits the concentrating optical elements and the lightguide member to be produced at low cost and obviates the necessity for alignment of the optical axes between the concentrating optical elements and the lightguide member. It is thus feasible to provide the inexpensive concentrating photovoltaic module with higher accuracy.

It is also preferable to employ a configuration wherein a light transmissive member with light transmitting property is placed between the lightguide member and the solar cell and wherein a refractive index of the light transmissive member is greater than that of the lightguide member. This can decrease the reflection loss when the sunbeams having traveled in the lightguide member emerge from the exit face of the lightguide member. Therefore, the sunbeams can be efficiently guided to the solar cell.

The exit face of the lightguide member is preferably kept in close contact with the solar cell. This permits the sunbeams having traveled in the lightguide member to be guided to the solar cell more efficiently, because the refractive indices of glass, resin, etc. used for the lightguide member are as low as 1.4 to 1.9 whereas those of materials for a surface layer, if provided, on the surface of the solar cell are 2 to 3.

It is also preferable to employ a structure wherein the module has reflective films at portions where the lightguide member is held. In the case where the sunbeams concentrated by the concentrating optical elements are incident off the centers of the entrance faces of the lightguide member and are guided to the aforementioned portions where the lightguide member is held, because of assembling errors or tracking errors in the concentrating photovoltaic module of the present invention, the foregoing structure can also reflect the sunbeams by the reflective films and minimize loss at the portions.

It is also preferable to provide a protective layer in a form covering the side faces of the lightguide member and in a state of no contact with the side faces of the lightguide member. This can prevent dust or contamination from attaching to the side faces of the lightguide member during long-term use and thus prevent trouble of decrease in reflectance on the side faces, thereby maintaining the performance of the lightguide member over a long period of time.

By combining the foregoing concentrating photovoltaic module with a sun tracking device, it is feasible to provide a concentrating photovoltaic power generating system of the tracking type comprising the inexpensive, compact concentrating photovoltaic module for efficiently concentrating the sunbeams on the solar cell without light quantity unevenness and spectral distribution dispersion. Since the concentrating photovoltaic module is compact, the cost of the sun tracking device can be decreased in terms of wind endurance and weight.

The present invention will be described below in further detail.

Figure 1B:
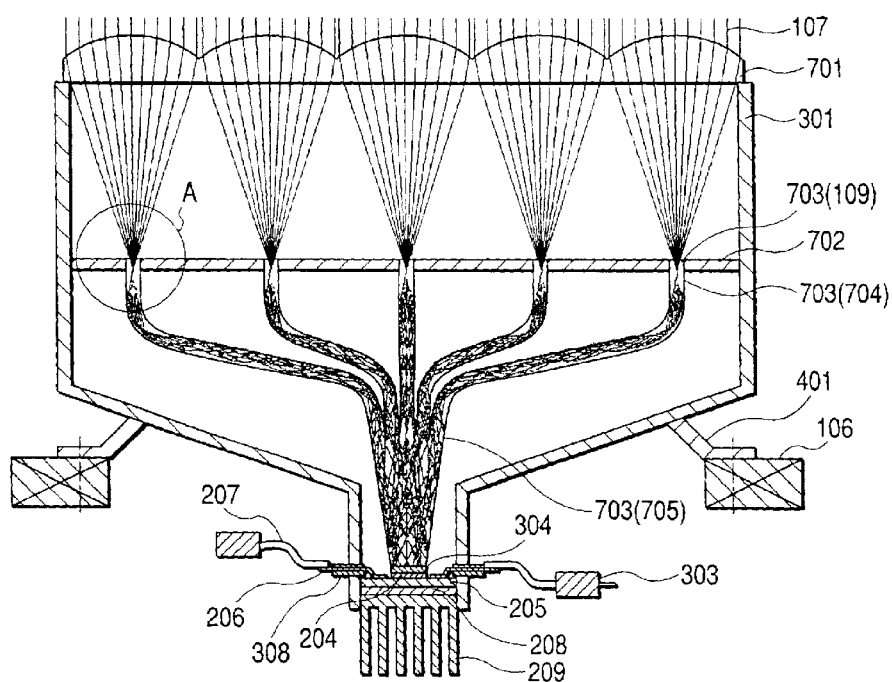
Figure 1C:
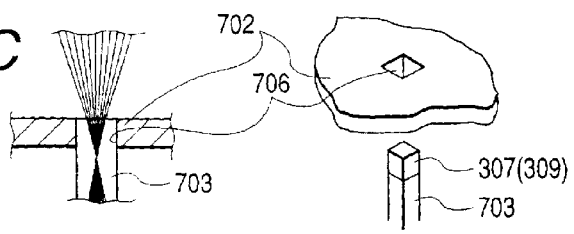

FIG. 1A is a perspective view showing the appearance of a concentrating photovoltaic power generating system. FIG. 1B is a sectional view of a concentrating photovoltaic module shown in FIG. 1A. FIG. 1C is an enlarged view of part A in the concentrating photovoltaic module shown in FIG. 1B.

The present invention is, for example as shown in FIGS. 1A to 1C, a concentrating photovoltaic module 102 comprised of a solar cell 204, a lightguide member 703 for guiding sunbeams 107 to the solar cell 204, and, preferably, concentrating optical elements 701 for concentrating the sunbeams 107 from the sun, and a concentrating photovoltaic power generating system 101 having the concentrating photovoltaic module 102 and a tracking device 103.

The following will detail the requirements for the respective constitutive elements.

(Concentrating Photovoltaic Module)

The concentrating photovoltaic module is comprised of a lightguide member having at least one exit face and a plurality of entrance faces; a solar cell placed immediately after the exit face; preferably, a concentrating optical element group comprising a plurality of concentrating optical elements being in a pair with the entrance faces of the lightguide member and functioning to concentrate the sunbeams from the sun in the vicinity of the entrance faces; and a housing intended for holding the concentrating optical element group, the lightguide member, and the solar cell and for protecting the concentrating optical element group, the lightguide member, and the solar cell from the external environment.

In view of the power generation efficiency and cost, the module is preferably provided with the concentrating optical element group having an aperture area 50 to 1000 times larger than an area of one solar cell.

In addition to the concentrating photovoltaic module comprised of the above constitutive elements one each, there are also concentrating photovoltaic modules of a unit type in which a plurality of lightguide members and a plurality of solar cells are incorporated by use of one housing and one concentrating optical element (wherein a plurality of concentrating optical element groups are made by integral molding).

If the solar cell is constructed according to specifications taking account of influence from the external environment, such as a waterproof treatment, an insulation treatment, etc., there is no need for the provision of such separate means as the housing or the like for protecting the solar cell from the external environment.

In the concentrating photovoltaic module, the solar cell being a portion for converting the energy of solar radiation to electric energy is normally used in combination with a circuit board having copper circuit boards connected to the solar cell to extract the electric energy, lead wires for leading the electric energy from the circuit board to the outside of the concentrating photovoltaic module, and a heat sink attached to the back surface of the circuit board and functioning to restrain increase of temperature of the solar cell. In the case of the aforementioned unit type concentrating photovoltaic module, the plurality of solar cells may be connected in series or in parallel in the module according to necessity and the electric energy may be led through the lead wires to the outside of the concentrating photovoltaic module.

It is noted that the present invention can embrace all configurations capable of implementing the same or similar functions, irrespective of the above-stated configurations.

(Concentrating Photovoltaic Power Generating System)

The concentrating photovoltaic power generating system is a system for generating electric power by the combination of the aforementioned concentrating photovoltaic module with the tracking device. Specifically, one or more aforementioned concentrating photovoltaic modules are used in mechanical connection to the tracking device. In this case, if there is a need for provision of a holding member for auxiliarily holding the concentrating photovoltaic module, a supporting mechanism for supporting it rotatably, and/or a transmitting mechanism for transmitting driving force to the tracking device, they are properly introduced according to necessity. The tracking device normally incorporates a control unit for predicting the route of the sun and controlling the tracking device according to the prediction, a sensor for detecting the position of the sun during fair weather, and so on. DC power generated in the concentrating photovoltaic module is utilized as it is, or is once stored in a storage battery and utilized according to necessity, or is converted to AC power by a power converter and thereafter utilized.

It is noted that the present invention can embrace all configurations capable of substantiating the same or similar functions, regardless of the above-stated configurations.

(Concentrating Optical Element Group)

The concentrating optical element group is an assembly of concentrating optical elements, which can be selected from the following configurations: a plurality of concentrating optical elements are made by integral molding; a plurality of concentrating optical elements are produced separately and thereafter combined by a mechanical joining means such as bonding, welding, screwing or the like; the individual concentrating optical elements are arranged without use of the mechanical joining means while waterproof means such as rubber packing or the like is simply placed between the concentrating optical elements; and so on.

The number of concentrating optical elements constituting the concentrating optical element group is preferably in 1:1 correspondence to the number of entrance faces of the lightguide member, but it is also possible to employ a configuration in which a plurality of concentrating optical elements are arranged to concentrate the sunbeams on one entrance face or a configuration in which one concentrating optical element is arranged to concentrate the sunbeams on a plurality of entrance faces.

Specifically, while consideration is given to formability of the concentrating optical elements, formability of the lightguide member, assemblage of the concentrating photovoltaic module, contribution to downsizing, etc., for example, in the case of the rectangular concentrating optical element group, it is preferable to employ either one of 4-divided (two vertical×two horizontal=totally four concentrating optical elements) to 100-divided (10 vertical×10 horizontal=totally one hundred concentrating optical elements) configurations.

The aperture shape of the concentrating optical element group can be either one of various shapes including rectangles, circles, polygons such as a regular hexagon and others, and so on, and in a concentrating photovoltaic module with priority to power generated per unit area, preferred shapes are rectangles, polygons, and the like that can be arrayed without a clearance.

The concentrating optical elements constituting the concentrating optical element group can be any elements capable of concentrating the sunbeams from the sun and guiding them to the entrance faces of the lightguide member, e.g., lenses collecting and concentrating the sunbeams through the use of refraction, such as Fresnel lenses, planoconvex lenses, biconvex lenses, prisms, compound lenses, etc.; reflectors collecting and concentrating the sunbeams through the use of reflection, such as concave reflectors and others; or combinations of these. It is, however, noted that the present invention can embrace all configurations capable of implementing the same or similar functions, without having to be limited to the elements listed above.

The most preferable concentrating optical elements making use of refraction are planoconvex lenses with an aspherical surface convex on the photoreceptive surface side, having high optical efficiency, small spherical aberration and coma, and good formability.

Namely, spherical lenses (and aspherical lenses) are superior in structure and formability and in optical efficiency to the approximate lenses such as the Fresnel lenses or the like.

The concentrating optical elements with small spherical aberration and coma lead to expansion of the permissible incidence angle range of the concentrating photovoltaic module (relief of the tracking accuracy of the tracking device, relief of the forming accuracy of the concentrating photovoltaic module, effective utilization of the circumsolar radiation, etc.) and is one of most effective means in terms of enhancement of the power generation efficiency of the concentrating photovoltaic module.

In use of the planoconvex lenses with the aspherical surface convex on the photoreceptive side as the concentrating optical elements, the F-number (focal length÷aperture) of the concentrating optical elements is preferably 0.35 to 4 in view of the optical efficiency and more preferably 0.5 to 2 in view of the weight of the concentrating optical elements and expansion of the permissible incidence angle range.

Since the plurality of concentrating optical elements are used to concentrate the sunbeams on one solar cell, the size of each concentrating optical element becomes much smaller than that in the conventional concentrating photovoltaic modules (in which one concentrating optical element is used for one solar cell), so that the concentrating optical elements can also be constructed using the planoconvex lenses, which were hardly used in the conventional concentrating photovoltaic modules in terms of the weight, cost, size, and formability, thereby achieving the enhancement of the power generation efficiency of the concentrating photovoltaic module. The decrease in the size of the concentrating optical elements results in decreasing the focal length even in the case of use of the concentrating optical elements having the same F-number as that in the conventional concentrating photovoltaic modules, which permits compactification of the concentrating photovoltaic module.

When each concentrating optical element is an achromatic lens (in which two lenses with different optical characteristics are cemented), spherical aberration is almost null and the sunbeams can be concentrated at a point. When the concentrating optical elements are constructed of achromatic lenses, anomalous partial dispersion lenses, diffracting optical elements, or the like, chromatic aberration can be made almost null. However, since the dispersion of spectral distribution resulting from the chromatic aberration can be nullified by the mixing effect of the lightguide member (the effect of nullifying the spectral distribution dispersion during traveling of sunbeams through repeated total reflection (total internal reflection) in the lightguide member), a necessary condition for the concentrating optical elements is that they can focus the sunbeams in the wavelength region contributing to the power generation of the solar cell, approximately in the vicinity of the entrance faces of the lightguide member, so as to guide the sunbeams to the entrance faces.

The aperture shape of the concentrating optical elements can be either of various shapes including a rectangle, a circle, a regular hexagon, and so on, as the aperture shape of the concentrating optical element group could. In the case of the concentrating photovoltaic modules with priority to power generated per unit area, it is preferable to employ a shape permitting arrangement without a clearance, such as the rectangles, polygons, and so on.

A material for making the concentrating optical elements can be selected from light transmissive organic resins, glass, rubber, light transmissive crystals, or combinations of these, or also conceivably from air lenses, liquid lenses, etc. making use of air, liquid, or the like.

In the case of the organic resins, there are no specific restrictions on types thereof, but it is preferable in terms of light transmittance weatherability, formability, cost, resistance to adhesion of dust, etc. to employ either of PMMA, polycarbonate, fluororesins such as poly(ethylene tetrafluoroethylene) (ETFE), poly(trifluoroethylene), poly (vinyl fluoride), and so on, silicone resins, and so on.

In the case of glass, there are no specific restrictions on types thereof, but it is preferable to employ white sheet glass from the viewpoints of light transmittance in the blue region, strength, and so on.

The material is preferably one with excellent weatherability, because the elements are exposed to the external environment and, particularly, preferably a material that is less deteriorated by ultraviolet rays and by rain and temperature/humidity.

The material is preferably one having high transmittances in the wavelength region contributing to the power generation of the solar cell and more preferably one having transmittances of not less than 90%. It is also possible to utilize a material with selectivity to transmitted wavelengths, or add an additive having the same function to the material, thereby cutting the sunbeams in the short wavelength region causing the deterioration of the material. It is also possible to provide the front surfaces and/or the back surfaces of the concentrating optical elements with various coat layers to add functions of decreasing the reflectance, cutting the ultraviolet rays, enhancing abrasion resistance of the concentrating optical elements, and so on. When a high-index material is applied, the sunbeams can be concentrated in a shorter focal length, so that the size of the concentrating photovoltaic module can be decreased further.

(Lightguide Member)

The lightguide member is made of a medium having at least one exit face and a plurality of entrance faces, preferably, a plurality of entrance faces paired up with the concentrating optical elements, being light transmissive and solid, and having no refractive-index-discontinuity portion, the surface of the lightguide member is smooth, and the lightguide member functions to make the sunbeams concentrated by the concentrating optical elements, incident on the entrance faces, totally reflected on the side faces (total internal reflection), mixed in the lightguide member, and thereafter guided to the solar cell placed immediately after the exit face.

Figure 9:
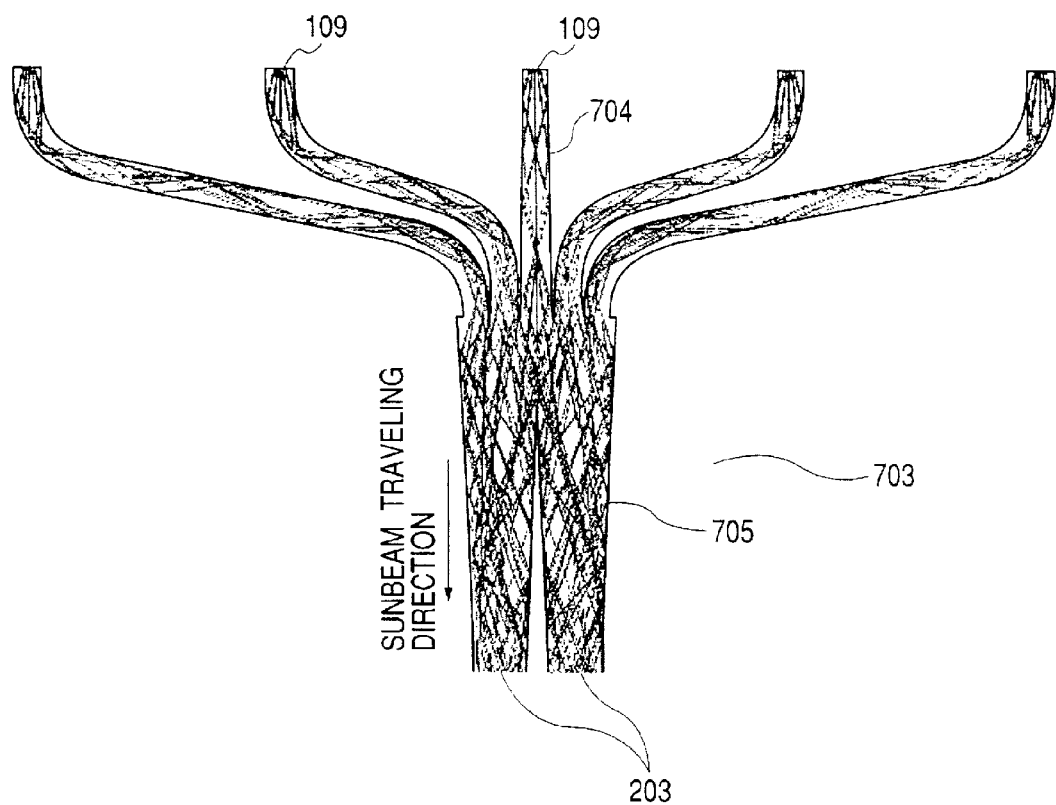
FIG. 9 is a view showing an example of the shape of the lightguide member and paths of sunbeams.

A specific shape of the lightguide member is preferably one wherein the lightguide member consists of a trunk and a plurality of branches extending from the trunk, the lightguide member has the exit face at the root of the trunk and the entrance faces at the distal ends of the branches, and the sunbeams entering the entrance faces are mixed in the branches and trunk and thereafter guided to the solar cell. It is also possible to employ such a shape that, as shown in FIG. 9, the trunk 705 is divided into two or more branches immediately before exit faces 203 and a plurality of solar cells are placed immediately after a plurality of exit faces 203.

Figure 10A:
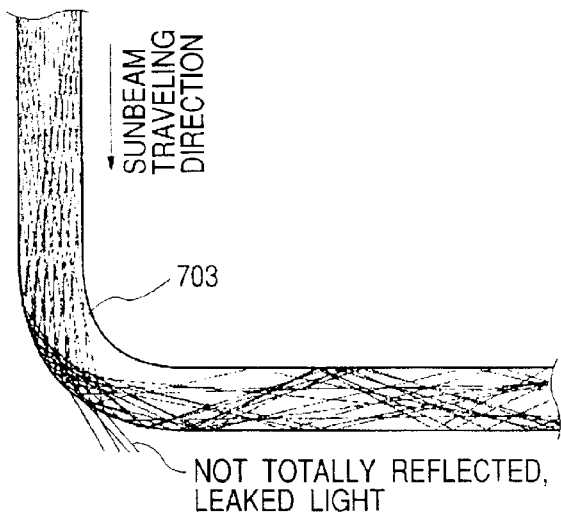
FIGS. 10A, 10B, 10C and 10D are views illustrating bent states of the lightguide member and paths of sunbeams.
Figure 10B:
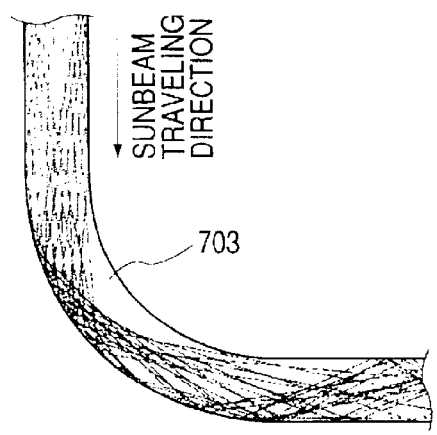

The shape of the trunk or the branches is preferably one not hindering the total reflection of the sunbeams contributing to the power generation of the solar cell, among the sunbeams traveling toward the solar cell inside the lightguide member, and can be either of various shapes including the straight shape, 90°-bent shape, 180°-bent (backwardly bent) shape, and so on. Namely, the shape is preferably one permitting the sunbeams traveling in the lightguide member to be totally reflected in the state below the critical angle on the side faces of the lightguide member before they reach the solar cell. For example, FIG. 10A shows an example in which the total reflection of sunbeams is hindered in part to leak a part of the sunbeams outside the lightguide member 703 because of a too small curve R of the lightguide member 703. FIG. 10B shows an example in which the lightguide member 703 is designed with an optimal curve R.

Figure 10C:
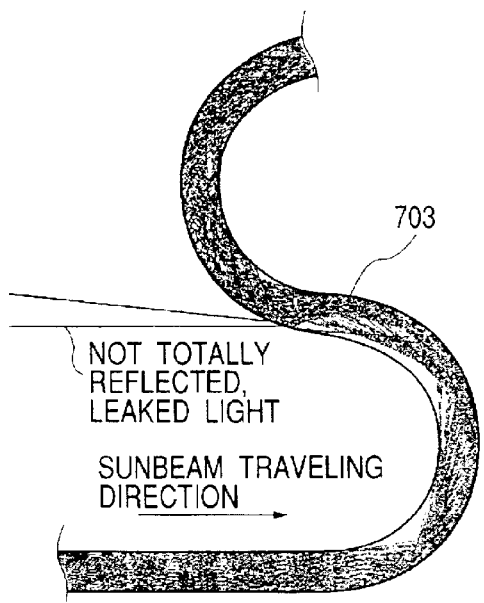
Figure 10D:
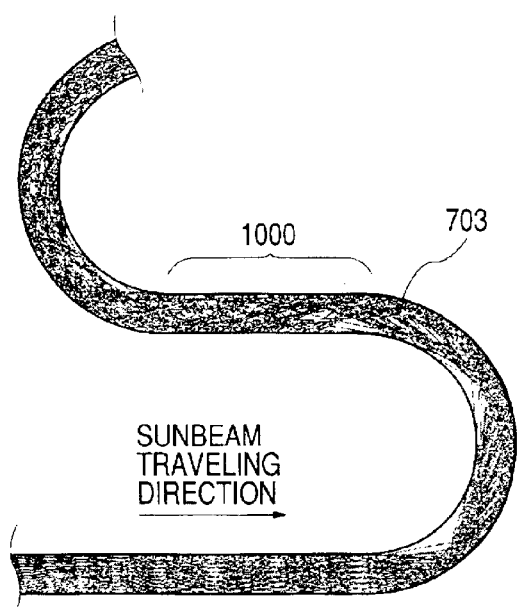

Since the total reflection of sunbeams is readily hindered to effect leak of a part of the sunbeams in a quickly changing curvature shape like a shape of "a right turn immediately after a left turn" as shown in FIG. 10C, the total reflection of sunbeams can be prevented from being hindered, by employing a shape of "a straight portion 1000 provided immediately after a left turn, and a right turn made after the straight portion" as shown in FIG. 10D.

Figure 11:
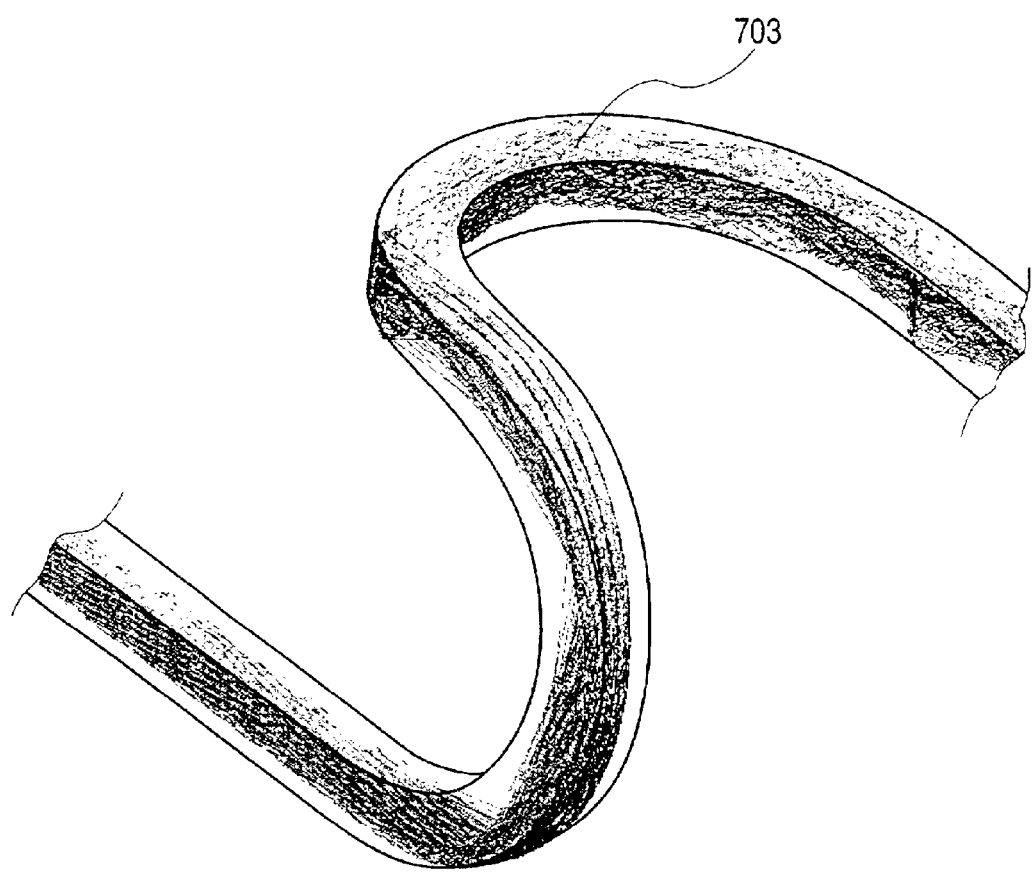
FIG. 11 is a view illustrating a three-dimensional bent state of the lightguide member and paths of sunbeams.

Taking the above into consideration, it is also feasible to employ a three-dimensional curve, as shown in FIG. 11, without having to be limited to only two-dimensional curves.

Figure 12A:
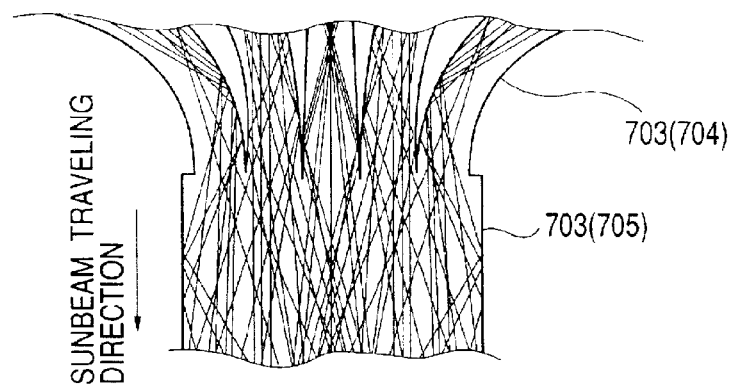
FIGS. 12A and 12B are views showing an example of the shape of a merging portion of branches of the lightguide member or a merging portion of branches and a trunk.
Figure 12B:
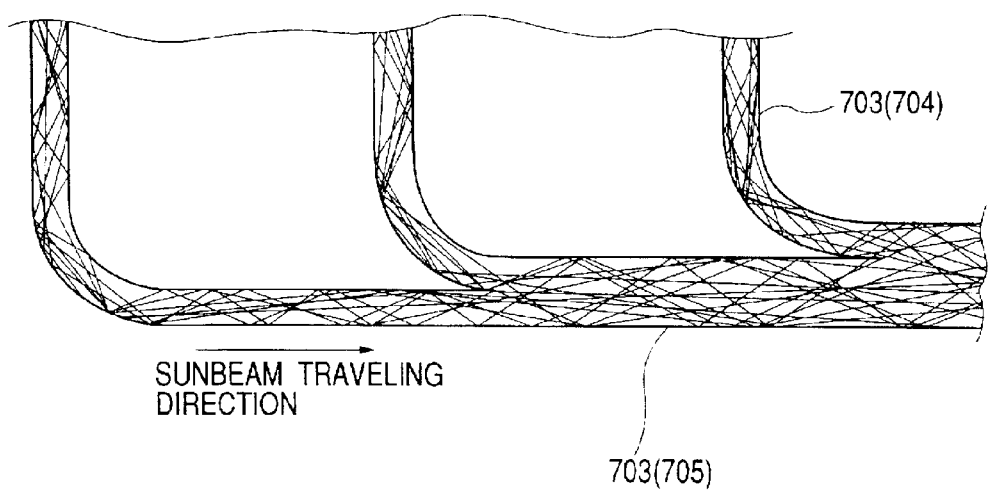

The shape of the merging portion of the branches or the shape of the merging portion of the branches and the trunk is also preferably one not hindering the total reflection of the sunbeams contributing to the power generation of the solar cell, among the sunbeams traveling toward the solar cell inside the lightguide member, as shown in FIGS. 12A and 12B.

The shape of the trunk and branches is preferably one capable of preventing the sunbeams entering the entrance faces of the lightguide member, from returning to the entrance faces.

Specifically, decrease of curvature R to small values or sudden decrease of cross section toward the solar cell will cause the hindrance against the total reflection of the sunbeams or the return of the sunbeams toward the entrance faces.

Figure 13A:
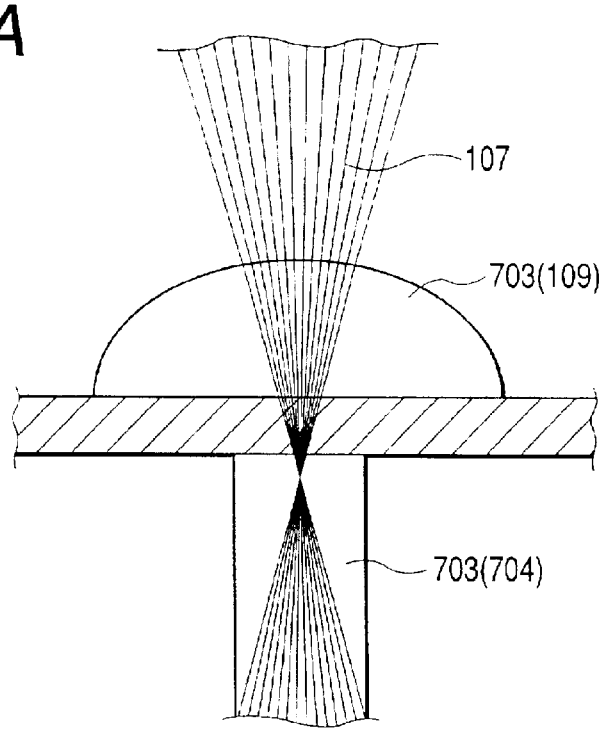
FIGS. 13A and 13B are views showing an example of the shape of the entrance faces of the lightguide member.
Figure 13B:
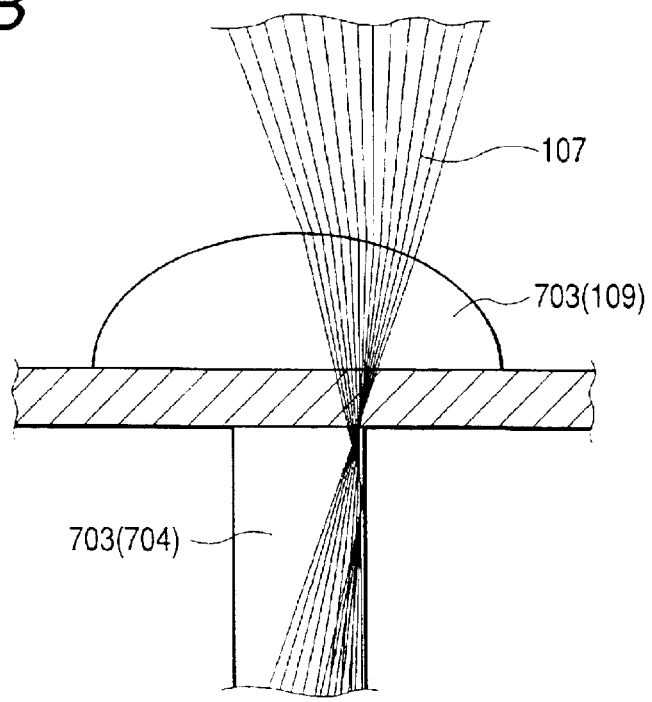

When the entrance faces of the lightguide member are spherical surfaces or aspherical surfaces convex on the photoreceptive surface side, as shown in FIGS. 13A and 13B, even the sunbeams arriving with deviation at the entrance faces of the lightguide member can be guided into the lightguide member. Namely, even if the sunbeams arrive with deviation at the entrance faces of the lightguide member because of the aberration of the concentrating optical elements, tracking errors of the tracking device, or the forming errors of the concentrating photovoltaic module, they can be again concentrated on the entrance faces of the lightguide member by the concentrating effect of the entrance faces of the lightguide member. Further, the circumsolar radiation can also be guided to the solar cell, which results in enhancing the generation efficiency of the concentrating photovoltaic module.

When the shape of the exit face of the lightguide member is substantially the same as the shape of the solar cell, the sunbeams emerging from the exit face can be efficiently guided to the solar cell.

The lightguide member is preferably of a structure capable of guiding the concentrated sunbeams without light quantity unevenness and spectral distribution dispersion to the solar cell.

Figure 14:
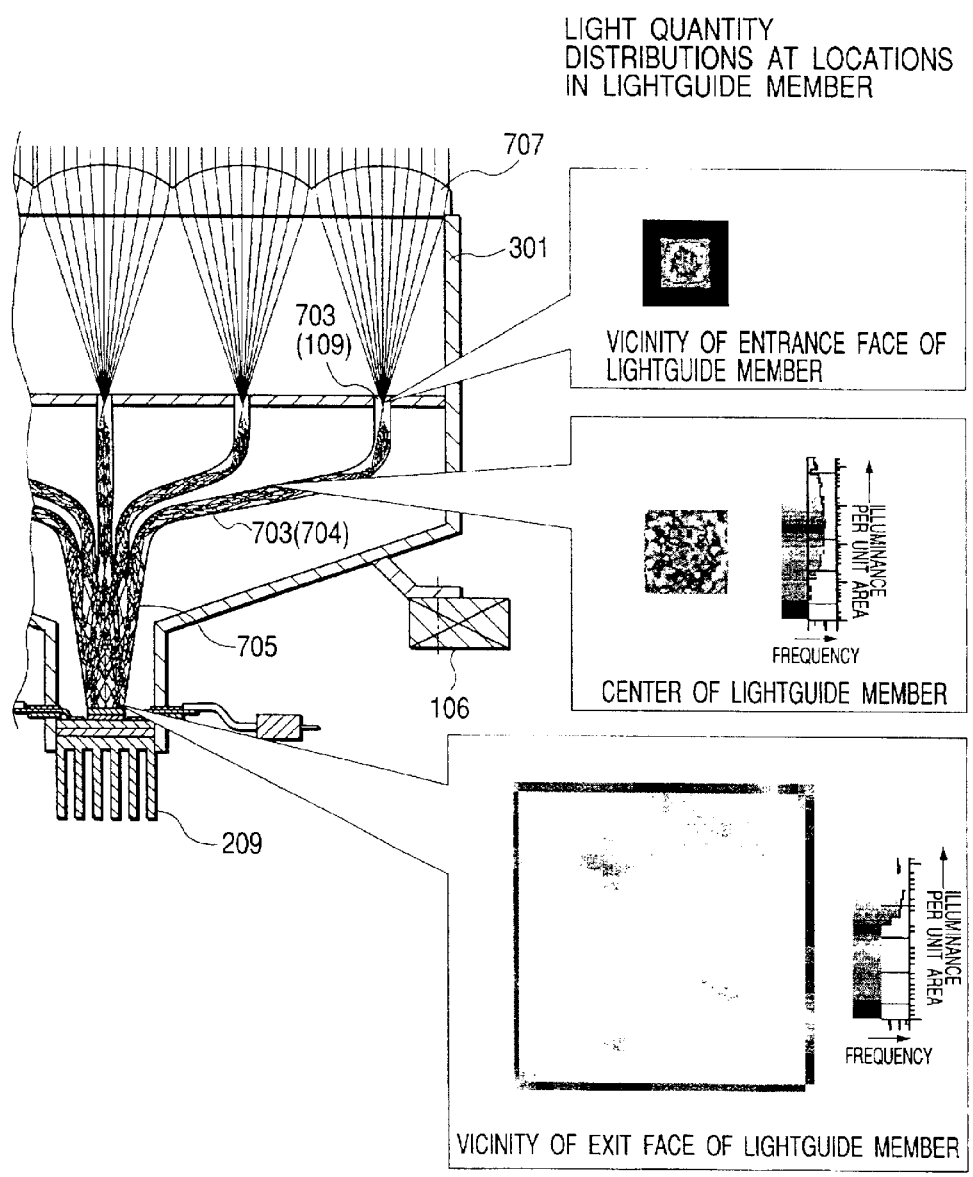
FIG. 14 is a view showing light quantity distributions inside the lightguide member at a location near an entrance face, a center, and a location near an exit face of the lightguide member.

Specifically, the mixing of the sunbeams traveling as totally reflected inside the lightguide member is enhanced by increasing the optical path lengths in the lightguide member. FIG. 14 is a view showing light quantity distributions at locations in the lightguide member and histograms of the light quantity distributions. In the histograms, the abscissa indicates frequency and the ordinate indicates illuminance per unit area. Although the light quantity unevenness is large at a location near the entrance face of the lightguide member, the mixing of the sunbeams progresses to nullify the light quantity unevenness with the optical path length increasing via a center of the lightguide member up to a location near the exit face of the lightguide member. Further, the spectral distribution dispersion also becomes null by the mixing effect of the lightguide member. For determining the optical path lengths in the lightguide member, it is thus preferable to determine the optical path lengths capable of reducing the light quantity unevenness and spectral distribution dispersion to the level causing no effect on the power generation performance of the solar cell in consideration of the refractive index, various properties, and others of the material of the lightguide member, whereby the solar cell can be used with high efficiency.

The mixing of sunbeams also differs depending upon the sectional shape of the trunk and branches of the lightguide member and the mixing becomes better in the named order of rectangles, polygons (pentagons or higher), and circles. The sectional shape of the trunk and branches is preferably rectangular in consideration of the mixing of sunbeams, formability, and the shape of the merging portion of the branches, or the merging portion of the branches and trunk.

For mechanically holding the lightguide member, it is necessary to employ a holding method with such consideration as not to hinder the total reflection of the sunbeams traveling as totally reflected inside the lightguide member.

Namely, when the lightguide member is held on the side faces, the total reflection of sunbeams can be hindered, so as to cause loss. Therefore, reflecting films such as silver deposited films, aluminum deposited films, or the like are preliminarily provided at lightguide-holding portions and the area necessary for the holding is set as small as possible, whereby the loss can be minimized at the holding portions.

When the concentrating optical elements are optical systems having their respective focal points approximately in the vicinity of the entrance faces of the lightguide member, there appear areas where the total reflection of sunbeams does not occur on the side faces of the lightguide member near the focal points. Therefore, when the lightguide member is held in the areas, the lightguide member can be firmly held only in those areas, without hindering the total reflection of the sunbeams. However, it is more preferable to provide the reflecting films such as the aluminum deposited films (aluminum deposited coating), silver deposited films (silver deposited coating), or the like at the lightguide-holding portions, considering the possibility that the sunbeams concentrated by the concentrating optical elements are incident with deviation from the centers of the entrance faces of the lightguide member because of the assembling errors of the concentrating photovoltaic module or the tracking errors and then arrive at the lightguide-holding portions.

Figure 15A:
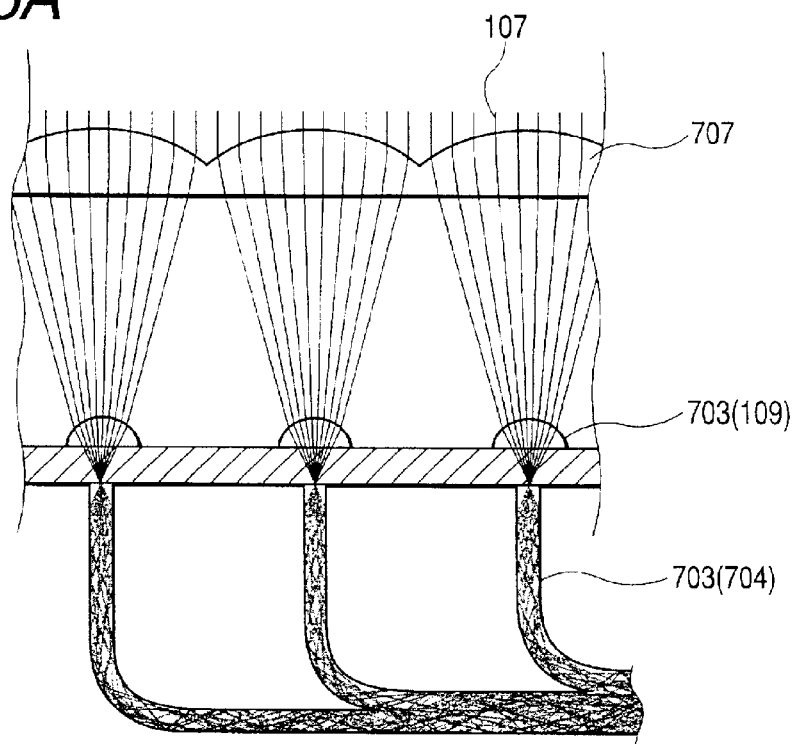
FIGS. 15A and 15B are views showing an example in which the lightguide member is retained by a projection provided at a 90°-bent portion.
Figure 15B:
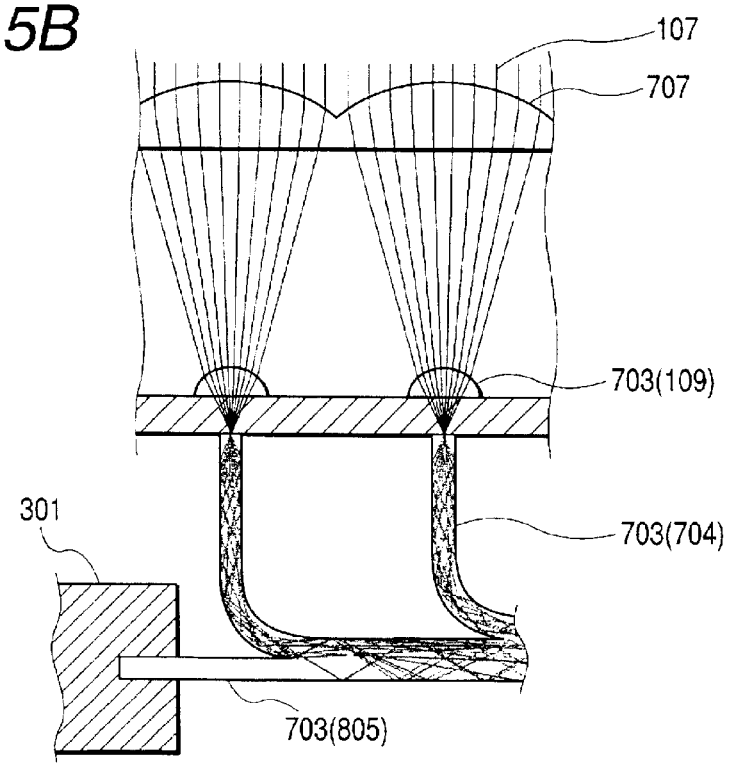

When a projecting portion is provided outside a 90°-bent or 180°-bent (backwardly bent) portion of the trunk or the branches of the lightguide member, there is an area without entry of the sunbeams in the lightguide member, and thus the lightguide member can also be firmly held by use of the projecting portion. For example, FIGS. 15A and 15B show an example in which the lightguide member 703 is held by a method of providing a projecting portion 805 at a 90°-bent portion and pinching that portion by a housing 301.

The material for making the lightguide member is preferably a material having high transmittance for the sunbeams traveling inside the material (which will be referred to hereinafter as internal transmittance and which is transmittance excluding the reflection on the entrance faces and the exit face of the lightguide member), and is preferably selected from glass materials and resin materials used as materials for optical lenses and cores of optical fibers. Specifically, the glass materials can be quartz glass and white sheet glass, and the resin materials can be PMMA, polycarbonate, polystyrene, polyester, and so on. It is more preferable to employ either of the resin materials in consideration of formability and cost.

When the lightguide member is of a complex shape, the lightguide member cannot be made by integral molding and it is thus necessary to make the lightguide member by joining a plurality of components. In this case, the lightguide member is made of a material capable of polymerization adhesion like PMMA or the like; a plurality of components are first molded, thereafter the components are bonded to each other by polymerization adhesion, and junction interfaces can also be made of the same medium. As a result, the lightguide member can be formed of the medium having no refractive-index-discontinuity portion. The same effect can also be achieved by bonding the components constituting the lightguide member with an adhesive having the same refractive index as that of the lightguide member.

The material for making the lightguide member is preferably a medium having no refractive-index-discontinuity portion.

Namely, in the case of the materials causing the total reflection by the index difference in the media like the optical fibers, the index difference between the media cannot be set so large, so that the critical angle becomes large and the permissible incidence angle range of the entrance faces of the optical fibers becomes narrow. For that reason, in order to efficiently guide the sunbeams into the optical fibers, it becomes necessary to use the concentrating optical elements having a large F-number and thus the concentrating photovoltaic module becomes large in size. Since the increase of the F-number increases the deviation amount of the sunbeams incident with deviation from the normal direction to the concentrating optical elements, from the centers of the entrance faces upon arrival at the entrance faces of the lightguide member, the permissible incidence angle range of the concentrating photovoltaic module becomes smaller and becomes more sensitive to the tracking errors of the tracking device and the molding errors, so as to cause degradation of the generation efficiency of the concentrating photovoltaic module. The optical fibers with large critical angles are also inferior in the mixing of light.

The material for making the lightguide member is more preferably a uniform medium. It allows the lightguide member to be made by integral molding, thereby achieving reduction of cost.

The internal transmittance per path length from the entrance faces to the exit face of the lightguide member (paths of the sunbeams traveling as repeatedly totally reflected, which are longer than the entire length of the lightguide member) is preferably not less than 80% and more preferably not less than 90%. Namely, since the increase of path length also increases energy loss in the wavelength region of low internal transmittance among the wavelength region contributing to the power generation of the solar cell, sufficient care should be given in selecting the material. By utilizing a material with selectivity to transmitted wavelengths or mixing an additive having the same function into the material, it is also feasible to cut the short wavelength region responsible for the deterioration of the material. Since use of a high-index material permits the sunbeams to be mixed in a shorter lightguide length, the size of the concentrating photovoltaic module can be decreased as a result.

Since the sunbeams traveling in the lightguide member experience not a little energy loss in proportion to optical path lengths, attention also has to be given to the shape of the lightguide member, in addition to the attention to the material. Namely, while the sunbeams travel in the lightguide members having the same length, the optical path lengths greatly differ depending upon angles of total reflection on the side faces of the lightguide member. Thus the energy loss due to the internal transmittance can be reduced by properly selecting the F-number of the concentrating optical elements, the shape of the entrance faces of the lightguide member, and the sectional shape and area of the trunk and branches of the lightguide member so as to make the sunbeams incident at shallow angles to the side faces in the lightguide member.

However, since decrease of the total reflection angle results in increasing the size of the concentrating photovoltaic module, it is necessary to properly select the shape.

In one concentrating photovoltaic module a light concentration magnification value of the lightguide member can be varied on the basis of "the total area of the entrance faces of the lightguide member÷the total area of the exit face of the lightguide member."

Namely,

"the total area of the entrance faces of the lightguide member÷the total area of the exit face of the lightguide member"=1 . . . Concentration magnification of the lightguide member=1;

"the total area of the entrance faces of the lightguide member÷the total area of the exit face of the lightguide member">1 . . . Concentration magnification of the lightguide member>1;

"the total area of the entrance faces of the lightguide member÷the total area of the exit face of the lightguide member"<1 . . . Concentration magnification of the lightguide member<1.

Specifically, a means for varying the total area of the entrance faces of the lightguide member and the total area of the exit face of the lightguide member can be substantiated by changing the cross section of the trunk or branches of the lightguide member along the longitudinal direction of the trunk or the branches. However, care has to be given in that case, because quick change of cross section will easily hinder the total reflection of sunbeams. If the concentration magnification of the lightguide member is desired to be set large under the condition of "the total area of the entrance faces of the lightguide member÷the total area of the exit face of the lightguide member"<1, the cross section of the trunk or the branches is reduced at a portion as close to the exit face as possible, as shown in FIGS. 16A to 16C, which can decrease the optical path lengths of the sunbeams and thus can decrease the energy loss due to the internal transmittance.

Figure 16A:
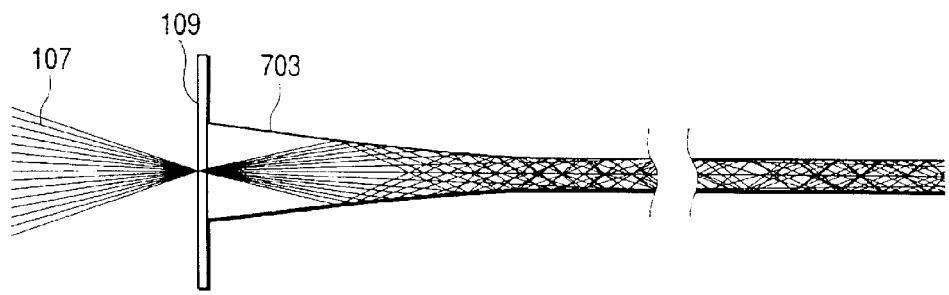
Figure 16B:
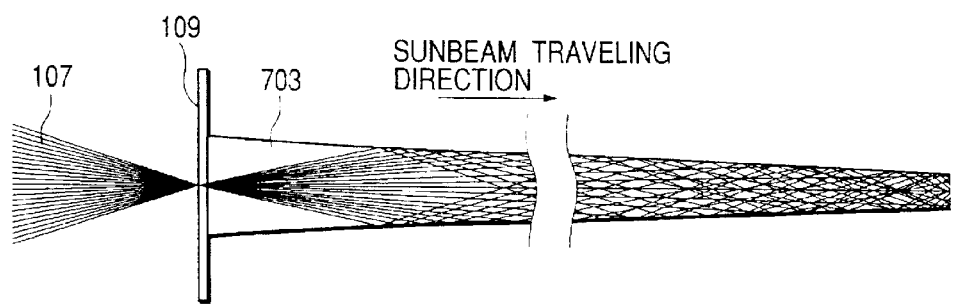
Figure 16C:
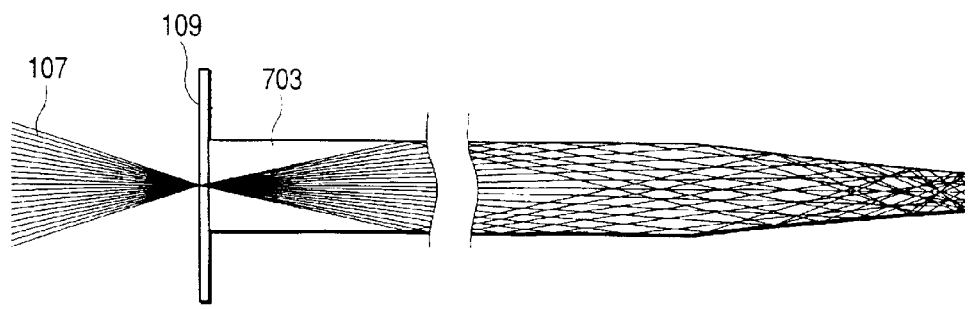
Figure 17:
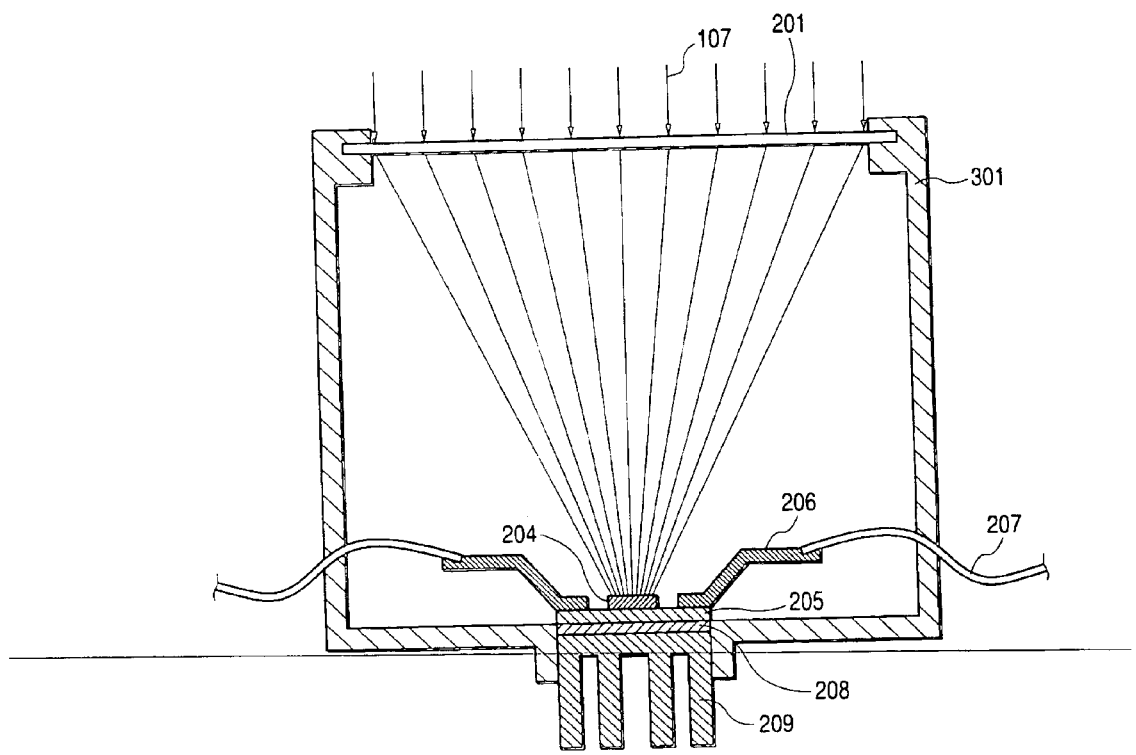
FIG. 17 is a view illustrating an ordinary concentrating photovoltaic module.

FIG. 16A shows a configuration in which the sunbeams are concentrated in the first half of the lightguide member (the path lengths of sunbeams are the longest). FIG. 16B shows a configuration in which the sunbeams are concentrated in the whole of the lightguide member. FIG. 16C shows a configuration in which the sunbeams are concentrated in the second half of the lightguide member (the path lengths of sunbeams are the shortest).

Since there occurs energy loss of sunbeams because of the reflection on the entrance faces and exit face of the lightguide member, it is preferable to reduce the energy loss due to the foregoing reflection, by providing an antireflection coating or the like.

Since the sunbeams concentrated by the concentrating optical elements enter the lightguide member, the lightguide member conceivably increases its temperature. Therefore, it is preferable to use a material with excellent heat resistance or a material with low heat absorptance.

The reflectance of total reflection of the sunbeams on the side faces of the lightguide member is theoretically 100%, but it is greatly lowered by poor smoothness of the surface or deposition of dust or contamination. Therefore, the surface roughness of the side faces is preferably low, and it is more preferable to treat the lightguide member itself by mirror finishing or the like, or to treat a mold for molding the lightguide member, by mirror finishing or the like. Since the aforementioned reflectance is largely lowered by deposition of dust or contamination on the side faces of the lightguide member under long-term use, a protective layer or the like is provided as countermeasures in a state of no contact with the side faces of the lightguide member, which can maintain the performance of the lightguide member over a long period of time.

(Solar Cell)

The solar cell is a member comprising an element or elements for converting the solar energy into electric energy and configured to receive the sunbeams on the element or elements to generate electric power. Applicable photoelectric conversion elements can be those of silicon, gallium arsenide, cadmium telluride, copper indium selenide, and so on, but, without being limited to those listed, they can involve all elements capable of implementing the same or similar functions. In general, such elements are called solar cells, solar battery cells, cells, photoelectric conversion elements, solar cell cells, etc., as well as the solar cells.

The solar cell is preferably placed immediately after the lightguide member and parallel to the exit face of the lightguide member.

Specifically, the sunbeams traveling in the lightguide member can be efficiently guided to the solar cell by means for providing a light transmissive member with light transmitting property between the lightguide member and the solar cell and using the light transmissive member having the refractive index greater than that of the lightguide member, means for keeping the exit face of the lightguide member in close contact with the solar cell, or the like. The means for keeping the exit face of the lightguide member in close contact with the solar cell can be either of means for pushing the exit face against the solar cell, means for forming the solar cell on the exit face, and so on. It is also possible to use an elastic material such as the fluororesins, silicone resins, etc. as the light transmissive member, whereby the lightguide member is prevented from interfering with the solar cell to damage the surface of the solar cell.

It is also possible to employ a configuration in which two or more solar cells are arranged for one exit face of the lightguide member.

Examples will be described below, but it is noted that the essence of the present invention is by no means limited to the specific description of the examples below.

EXAMPLE 1

FIGS. 1A–1C and FIG. 2 show the first example of the present invention. These figures schematically show the portions associated with the concentrating photovoltaic power generating system and the concentrating photovoltaic module.

Figure 2:
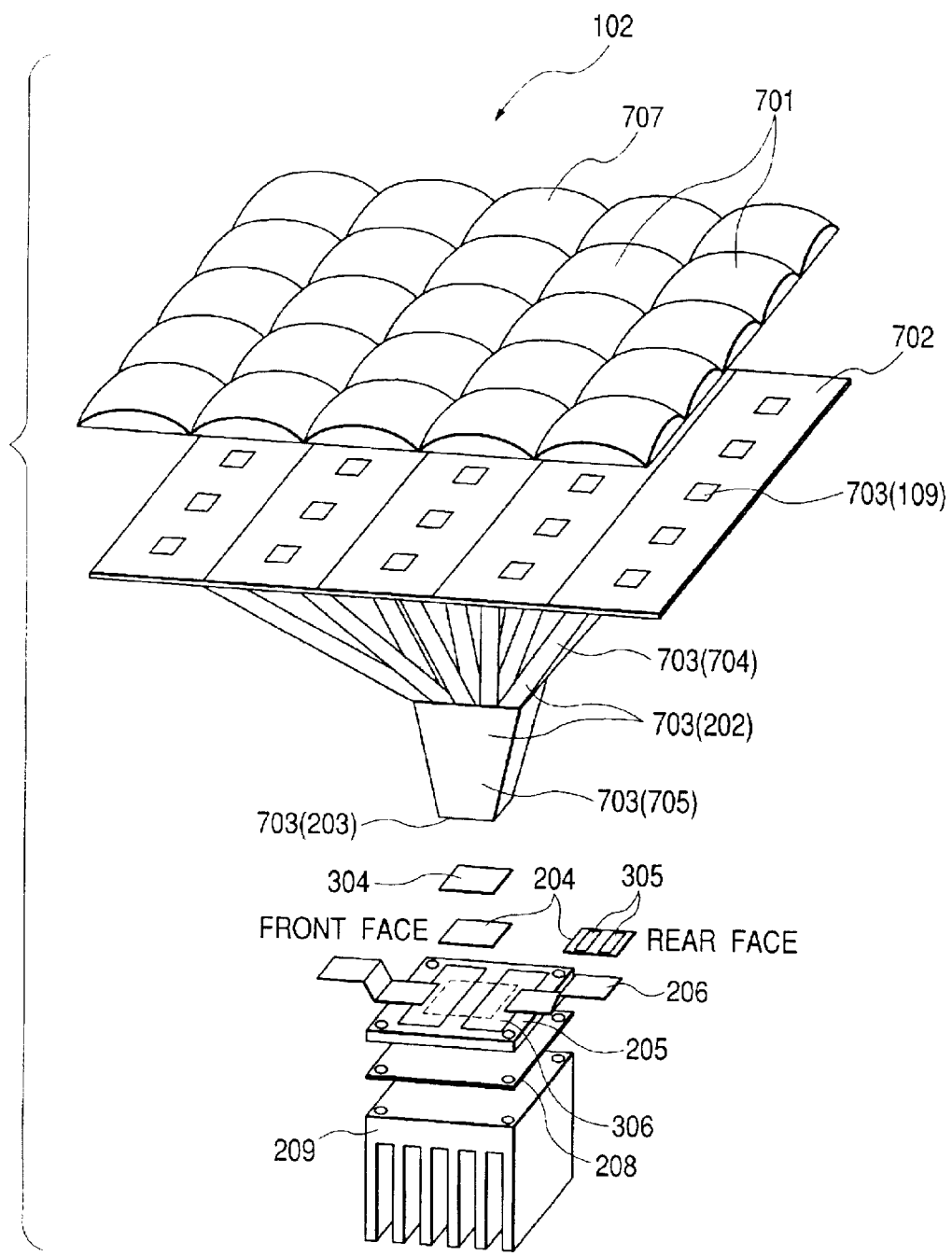
FIG. 2 is a view illustrating the first example of the present invention, which shows the structure of the concentrating photovoltaic module.

Specifically, FIG. 1A is a perspective view showing the appearance of the concentrating photovoltaic power generating system. FIG. 1B is a sectional view of a concentrating photovoltaic module shown in FIG. 1A. FIG. 1C is an enlarged view of part A in the concentrating photovoltaic module shown in FIG. 1B. FIG. 2 shows the structure of the concentrating photovoltaic module.

In FIGS. 1A to 1C, reference numeral 101 designates a concentrating photovoltaic power generating system, which is comprised of a plurality of concentrating photovoltaic modules 102 and a tracking device 103. The tracking device 103 is able to perform an operation of tracking the sun while determining the position of the sun by a control unit having the calendar and clock function and a sun position detecting sensor 104.

A tracking method can be either of a tracking method of rotating the system around independent rotation axes to change elevation and azimuth angles like a telescope at astronomical observatory and an anti-aircraft gun, a tracking method of preliminarily setting the elevation according to seasonal change of the sun route (declination change) and changing only hour angles, etc., either of which can be applied in similar fashion. The tracking accuracy of the tracking device 103 is required to be higher with increase in the concentrating magnification of the concentrating photovoltaic modules 102.

The plurality of concentrating photovoltaic modules 102 are properly connected in series or in parallel to output the generated DC power through lead wires 207 to the outside of the concentrating photovoltaic modules. The DC power is used as it is, or is once stored in a storage battery and used according to necessity, or is converted into AC power by a power converter and thereafter used.

The concentrating photovoltaic modules 102 are secured to a holding member 106 of the tracking device 103 with bolts and nuts. The securing means can be either of other joining means including screws, snap fitting, double-side adhesive tape, fixing band, welding, caulking, and so on, but the securing means is preferably one of detachable joining means in consideration of maintainability.

Each concentrating photovoltaic module 102 is comprised of a concentrating optical element group 107 consisting of a plurality of concentrating optical elements 701, the concentrating optical elements 701 collecting the sunbeams 107 from the sun and guiding the sunbeams to entrance faces 109 of lightguide member 703; the lightguide member 703 having at least one exit face 203 and a plurality of entrance faces 109 paired up with the concentrating optical elements 701; a solar cell 204 placed immediately after the lightguide member 703 and adapted for converting the sunbeams 107 guided from the lightguide member 703, into DC power; a circuit board 205 distributing the DC power generated by the solar cell 204 to the positive electrode and the negative electrode and holding the solar cell 204; electrode tabs 206 for guiding the DC power distributed by the circuit board 205, to lead wires 207; the lead wires 207 provided with connectors 303 for outputting the DC power generated by the concentrating photovoltaic module 102 to the outside of the concentrating photovoltaic module; a cooling structure for guiding heat generated by the solar cell 204 via the circuit board 205, thermally conductive sheet 208, and heat sink 209 and dissipating the heat into the outside atmosphere; and a housing 301 holding the foregoing constitutive elements and protecting the solar cell 204 from the external environment.

The concentrating optical element group 707 consisting of twenty five concentrating optical elements (5 vertical×5 horizontal=25 in total) is integrally molded of PMMA of the optical grade by injection molding and designed to guide the sunbeams 107 efficiently to the entrance faces 109 of the lightguide member 703.

Specifically, the concentrating optical elements 701 are planoconvex lenses with high optical efficiency, low spherical aberration and coma, and good formability, each having an aspherical surface convex on the photoreceptive surface side, the F-number is approximately 1.3 in consideration of the high optical efficiency and the weight and permissible incidence angle range of the concentrating optical elements, and the concentration magnification is about 250. If the aperture shape of the concentrating optical elements 701 is circular the generated power per unit area will be low. Therefore, the planoconvex lenses are first designed with the F-number of about 1.3 and in circular aperture shape and thereafter the aperture shape is designed into a shape determined by taking out only the square part inscribed in a circle by trimming.

An ultraviolet absorber is added into the concentrating optical element group 707 to prevent deterioration of the material with ultraviolet rays. Antireflection coatings are provided on the front and back surfaces of the concentrating optical element group 707 to reduce energy loss upon incidence or emergence of sunbeams 107.

The lightguide member 703 is integrally molded of PMMA of the optical grade with high internal transmittance in the wavelength region contributing to the power generation of the solar cell and heat resistant grade by injection molding and is designed to make the sunbeams 107 concentrated by the concentrating optical elements 701, incident on the entrance faces 109, totally reflected on side faces 202 and mixed in the lightguide member 703, and thereafter efficiently guided to the solar cell 204 placed immediately after the exit face 203.

A specific shape of the lightguide member 703 is such a shape that the lightguide member 703 consists of a trunk 705, and a plurality of branches 704 extending from the trunk, the lightguide member 703 has the exit face 203 at the root of the trunk 705 and the entrance faces 109 at the distal ends of the branches 704, and the sunbeams entering the incidence faces are mixed in the branches and trunk and thereafter guided to the solar cell.

The number of the branches and entrance faces is 25 while they are paired in 1:1 correspondence with the concentrating optical elements. The trunk is shaped so that it is tapered toward the exit face and the shape of the exit face is approximately the same as that of the solar cell.

At this time, where "the total area of the (25) entrance faces of the lightguide member÷the total area of the exit face of the lightguide member"=approximately 1.2 (=the concentrating magnification of the lightguide member), the concentrating magnification of the entire concentrating photovoltaic module is calculated as follows:

the concentrating magnification of the concentrating optical elements (about 250)÷the concentrating magnification of the lightguide member (about 1.2)=about 300.

The antireflection coatings are provided on the fear that there can occur loss due to the reflection on the entrance faces 109 and the exit face 203 of the lightguide member 703.

Between the exit face 203 of the lightguide member 703 and the solar cell 204, silicone rubber is placed as a light transmissive member 304 with light transmitting property and heat resistance for preventing the lightguide member 703 from interfering with the solar cell 204 to damage the surface of the solar cell 204. The light transmissive member 304 can be either of the other materials than the silicone rubber, including fluororubber, acrylic rubber, urethane resin, EVA, and so on, but the light transmissive member has to be properly selected in consideration of the ultraviolet resistance and heat resistance, the refractive index, and the transmittance.

If the refractive index of the light transmissive member is different from that of the lightguide member, there will arise concern about energy loss due to reflection at the interface between them. Therefore, it is necessary to employ countermeasures or reflection reducing means, e.g., provision of an antireflection coating on the exit face of the lightguide member.

The solar cell 204 is made of a crystalline silicon semiconductor. This solar cell 204 is one developed for the concentrating photovoltaic modules and having collecting electrodes on the non-photoreceptive side ("rear face" shown for reference in the drawings) and electrodes 305 (positive electrode and negative electrode) for outputting the DC power gathered from the collecting electrodes, to the outside of the solar cell, and the entire region of the photoreceptive side (referred to as "front face" in the drawings) is a power generating region.

The circuit board 205 is one obtained by directly joining copper circuit boards 306 (positive electrode and negative electrode) onto a ceramic substrate being an insulator with high thermal conductivity. The ceramic substrate can be either of an alumina plate, an AlN substrate, and so on.

The thermally conductive sheet 208 can be either of a thermally conductive rubber sheet, a silicone compound, a silicone grease, etc. commonly used for the purpose of heat conduction in joining the semiconductor to the heat sink.

The heat sink 209 is one obtained by cutting an extruded aluminum material into use size according to necessity. The surface of the aluminum material is treated by a black alumite (anodic oxide coating) treatment for the purpose of enhancing the cooling performance and weatherability.

The housing 301 is produced by joining and machining an aluminum alloy plate by pressing, bending, and welding. The surface of the housing is anodized to place an anodic oxide coating thereon for the purpose of enhancing weatherability. The material of the housing 301 can be either of various metals and nonmetallic sheets machined, weather-resistant resins to be molded into the housing, etc., in addition to the aluminum alloy plate thus machined.

The following will describe the procedure according to which the concentrating photovoltaic module 102 was actually produced from the above-stated constitutive elements.

First, the solar cell 204 and electrode tabs 206 were soldered to the copper circuit boards 306 on the circuit board 205 by reflow.

At this time, the solar cell 204 was placed opposite to the exit face 203 of the lightguide member 703.

Then the circuit board 205 was secured through the thermally conductive sheet 208 to the heat sink 209 with screws.

Then the heat sink 209 was secured to the housing 301 by screwing. On this occasion, the electrode tabs 206 were taken out through corresponding holes for leading out the electrode tabs 206, provided in the housing 301, and the holes were sealed by a water sealing treatment. Then the lead wires 207 with connectors 303 were connected to the corresponding electrode tabs 206.

Then lightguide holding portions 307 provided on the side faces 202 of the lightguide member 703 in the vicinity of the focal points were secured to the lightguide holding plate 702 preliminarily provided with holes 706 for the lightguide member 703 to pass therethrough and the lightguide holding plate 702 was held by the housing 301 so that the entrance faces 109 of the lightguide member 703 were located in the vicinity of the focal points of the concentrating optical elements 701. The lightguide holding portions 307 were preliminarily provided with reflecting films 309 by evaporation of aluminum. Then the exit face 203 of the lightguide member 703 was brought into contact through the light transmissive member 304 with the solar cell 204. At a final step, the concentrating optical elements 701 were secured to the aperture portion of the housing 301. Numeral 308 designates a bushing.

The following will describe the procedure according to which the concentrating photovoltaic power generating system 101 was actually fabricated from the concentrating photovoltaic modules 102 described above.

Module holding portions 401 of the concentrating photovoltaic modules 102 produced by the above method were fixed to the holding member 106 on the tracking device 103 with bolts and nuts. Then the lead wires 207 from the solar cell modules 102 were properly connected in series or in parallel to be guided to the outside by external output line 105 and the generated power was suitably utilized as it is, or was once stored in a storage battery and utilized according to necessity, or was converted into AC power by a power converter and thereafter utilized.

In each of the concentrating photovoltaic modules produced as described above, the concentrating optical elements functioned to concentrate the sunbeams in the vicinity of the entrance faces of the lightguide member and the sunbeams entering the entrance faces of the lightguide member were totally reflected with high efficiency on the side faces, were mixed in the lightguide member, and were efficiently guided without light quantity unevenness and spectral distribution dispersion to the solar cell.

Even if clouds or the like should cause light quantity unevenness of the sunbeams impinging on the concentrating optical element group, the sunbeams would be mixed in the lightguide member. Thus the sunbeams were guided without light quantity unevenness to the solar cell.

Since part of the lightguide member bears part of the necessary light concentration magnification, the concentrating magnification of the concentrating optical elements can be decreased by that degree. As a result, it is feasible to achieve compactification of the concentrating optical elements and compactification of the concentrating photovoltaic modules.

Since the reflecting films are provided on the lightguide holding portions for holding the lightguide member on the side faces thereof, the reflection loss can be minimized even with the sunbeams reaching the holding portions because of the tracking errors or the like, and the lightguide member can be firmly held. Further, since the lightguide member is held at the reflecting films by the housing, it is feasible to restrain deterioration of the material due to oxidation of the reflecting films themselves or the like.

Since the lightguide member is positioned within the hermetically closed space by the housing and the lightguide holding plate, it is feasible to prevent such trouble that dust or contamination attaches to the side faces of the lightguide member under long-term use to decrease the reflectance on the side faces, and to maintain the performance of the lightguide member over a long period of time.

EXAMPLE 2

Figure 3:
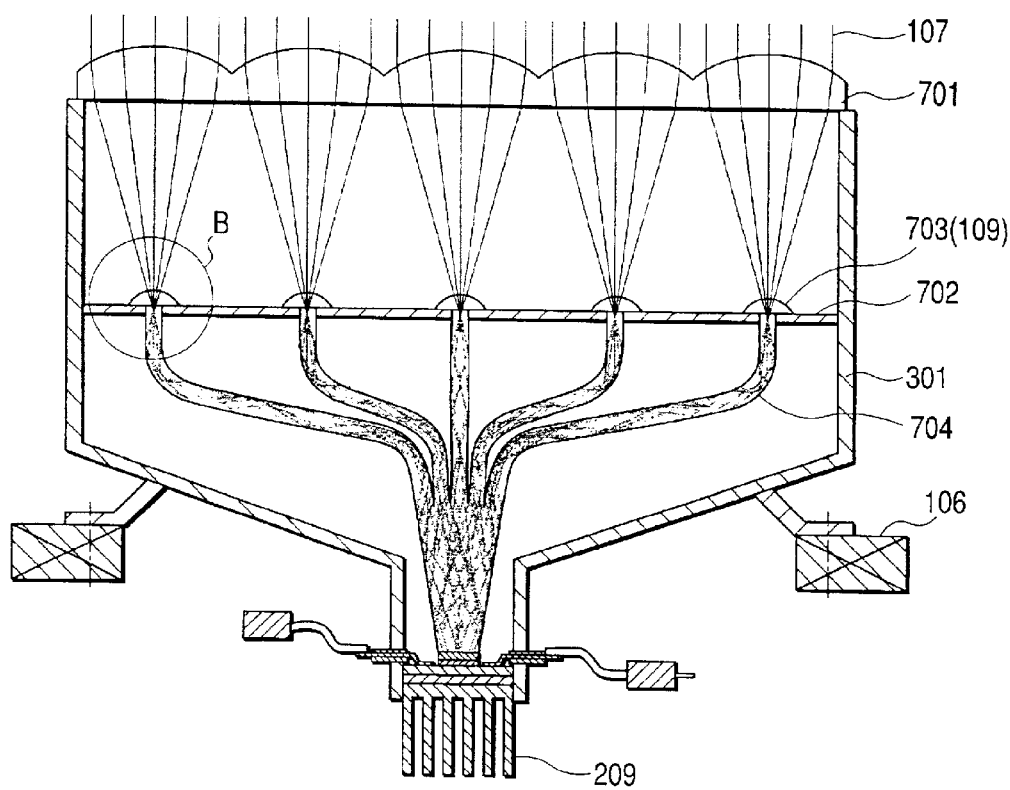
FIG. 3 is a view illustrating the second example of the present invention, which is a sectional view of a concentrating photovoltaic module.
Figure 4:
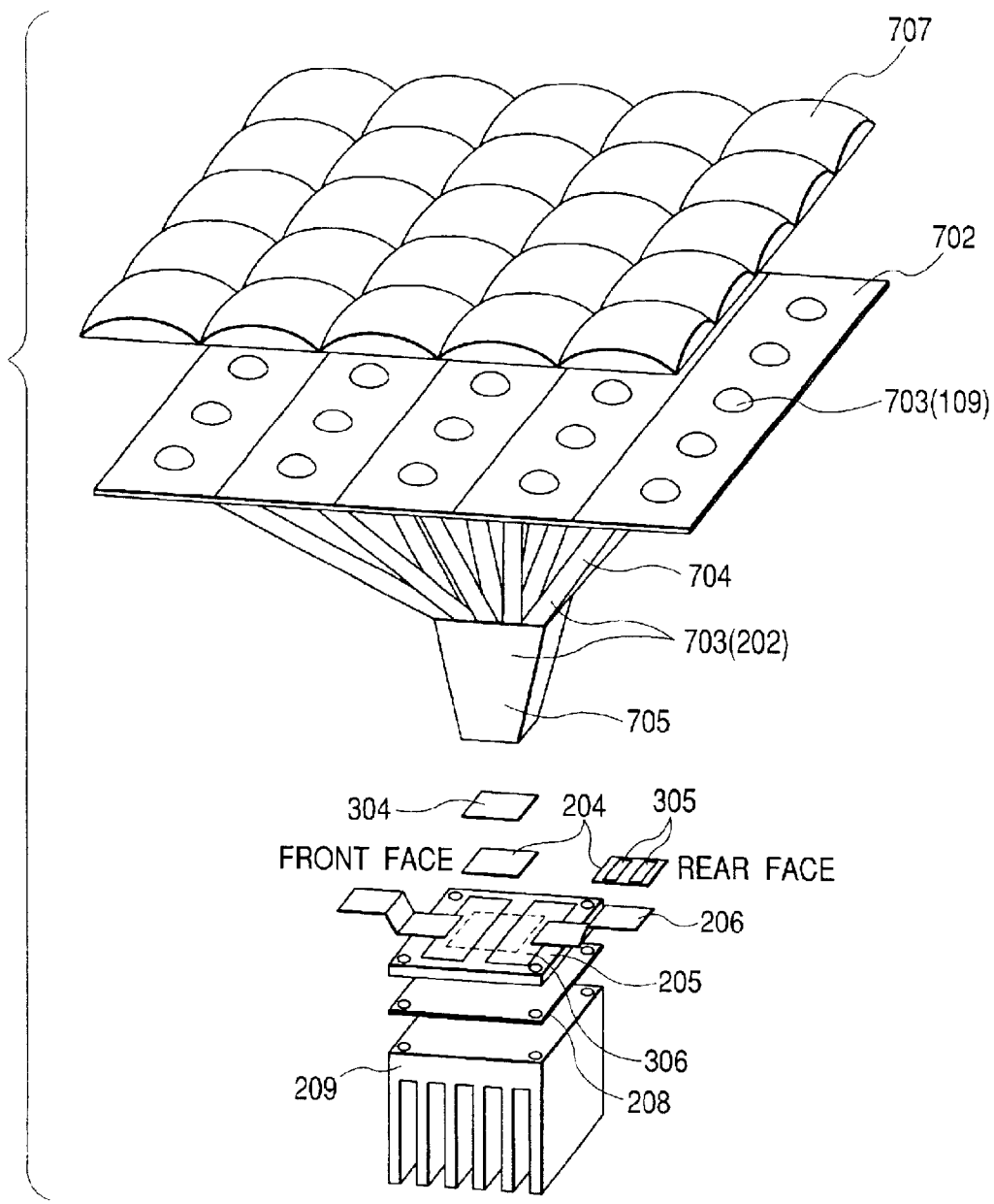
FIG. 4 is a view illustrating the second example of the present invention, which shows the structure of the concentrating photovoltaic module shown in FIG. 3.
Figure 5:
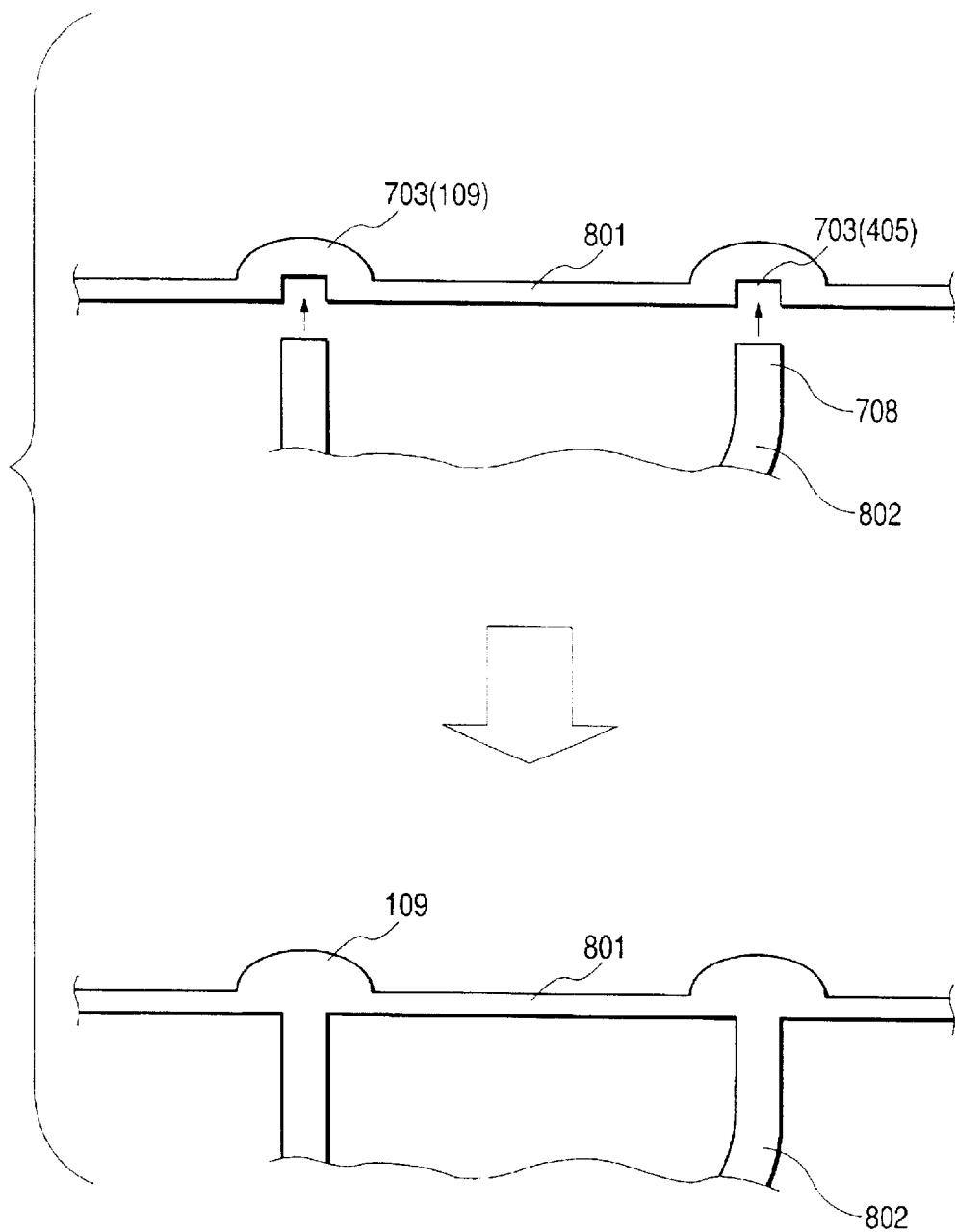
FIG. 5 is a view illustrating the second example of the present invention, which is an enlarged view of part B in the concentrating photovoltaic module shown in FIG. 3.

FIGS. 3 to 5 show the second example of the present invention.

FIG. 3 is a sectional view of a concentrating photovoltaic module. FIG. 4 shows the structure of the concentrating photovoltaic module shown in FIG. 3. FIG. 5 is an enlarged view of part B in the concentrating photovoltaic module shown in FIG. 3.

In the present example, the entrance faces of the lightguide member are of the aspherical shape convex on the concentrating optical element side, different from the concentrating photovoltaic module of Example 1.

Specifically, lightguide entrance face portion 801 and lightguide main body portions 802 were separately molded and were joined to each other to prepare the lightguide member.

This will be described below in detail.

First, the lightguide entrance face portion 801 was produced.

The lightguide entrance face portion 801 was integrally molded of PMMA of the optical grade and heat resistant grade by compression molding.

On this occasion, a plurality of aspherical lenses convex on the concentrating optical element side (entrance faces 109 of the lightguide member) were placed in 1:1 correspondence with the concentrating optical elements 701 constituting the concentrating optical element group 707 and so as to be located in the vicinity of the focal points of the respective concentrating optical elements 701. The aspherical lenses were designed so as to guide even the sunbeams arriving with deviation at the entrance faces of the lightguide member because of the aberration of the concentrating optical elements, the tracking errors of the tracking device, or the forming errors of the concentrating photovoltaic module, to the lightguide main bodies. Recesses 405 for receiving the lightguide main bodies 802 were provided on the nonphotoreceptive side of the aspherical lenses.

Then the lightguide main body portions 802 were produced.

The lightguide member 703 was integrally molded of PMMA being of the optical grade with high internal transmittance in the wavelength region contributing to the power generation of the solar cell and heat resistant grade and having the same refractive index as the PMMA used for the lightguide entrance face portion 801, by injection molding.

The specific shape of the lightguide member 703 was such that the lightguide member 703 consisted of a trunk 705 and a plurality of branches 704 extending from the trunk and had an exit face at the root of the trunk and projections 708 to be joined into the recesses 405 of the lightguide entrance face portion 801, at the distal ends of the branches 704.

At a next step, the lightguide member 703 was produced by joining the lightguide entrance face portion 801 and the lightguide main body portions 802 molded separately, to each other.

On this occasion, the recesses provided in the lightguide entrance face portion were bonded to the projections provided at the lightguide main body portions, by polymerization bonding. This allows joint interfaces to be also made of the same medium, so that the lightguide member can be made of the medium with a single refractive index. The same or similar effect can also be achieved by using an adhesive having the same refractive index as that of the lightguide member, for the bonding between the components making the lightguide member; in the case of the present example, by bonding the components with an acrylic adhesive.

The concentrating photovoltaic module produced as described above is able to guide even the sunbeams arriving with deviation at the entrance faces of the lightguide member, to the lightguide member.

Namely, even if the sunbeams should impinge with deviation on the entrance faces of the lightguide member because of the aberration of the concentrating optical elements, the tracking errors of the tracking device, or the forming errors of the concentrating photovoltaic module, they would be again concentrated on the entrance faces of the lightguide member by the concentrating effect of the entrance faces of the lightguide member. Further, it is also feasible to guide even the circumsolar radiation to the solar cell, which results in enhancing the generation efficiency of the concentrating photovoltaic module.

Since the lightguide member is comprised of the plurality of components and can be molded without reflection loss at the joint interfaces through the use of the polymerization bonding between the components or the bonding with the adhesive having the same refractive index, the lightguide member can be readily produced, for example, even in a complicated shape hard to be integrally molded.

EXAMPLE 3

FIGS. 6A–6C and 7A, 7B show the third example of the present invention.

Figure 6A:
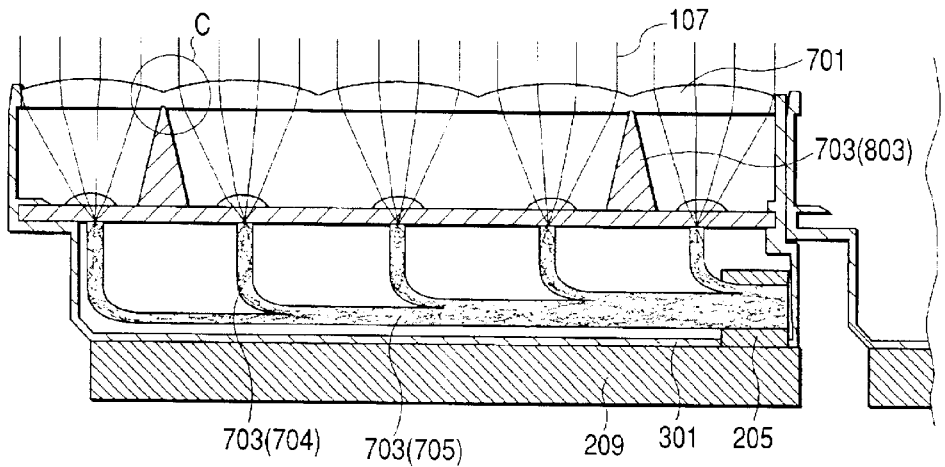
Figure 6B:
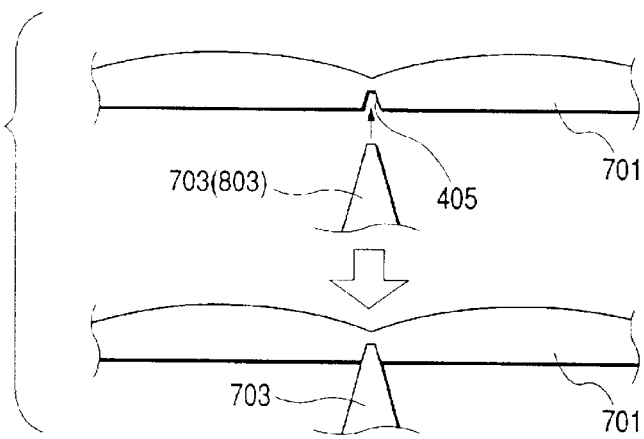
Figure 6C:
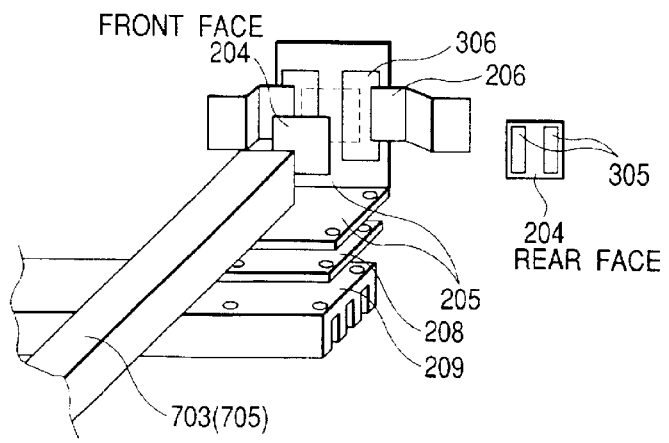
Figure 7A:
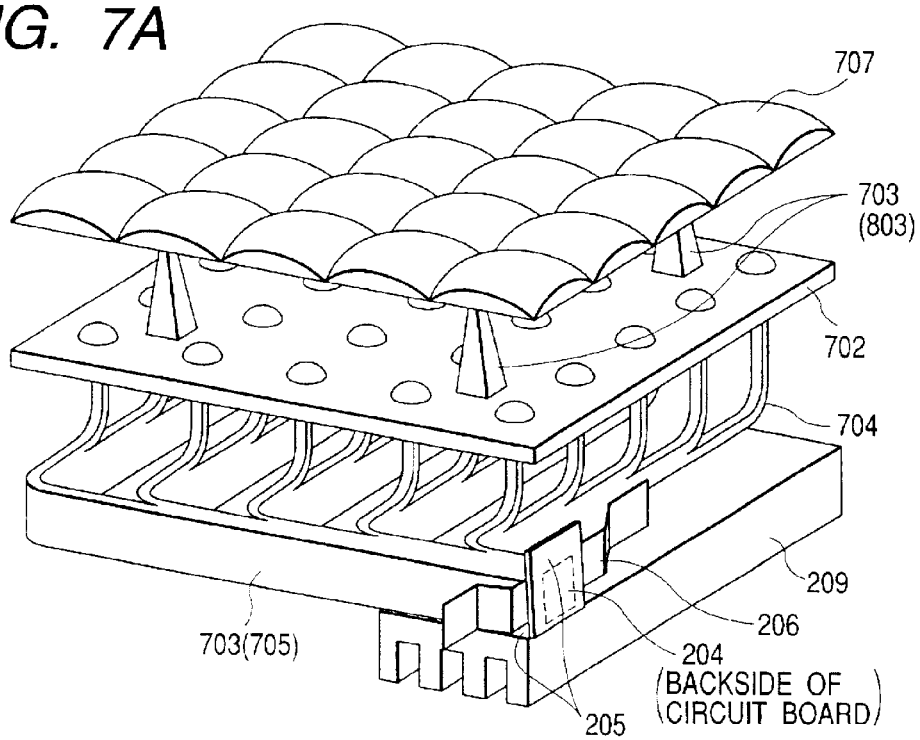
Figure 7B:
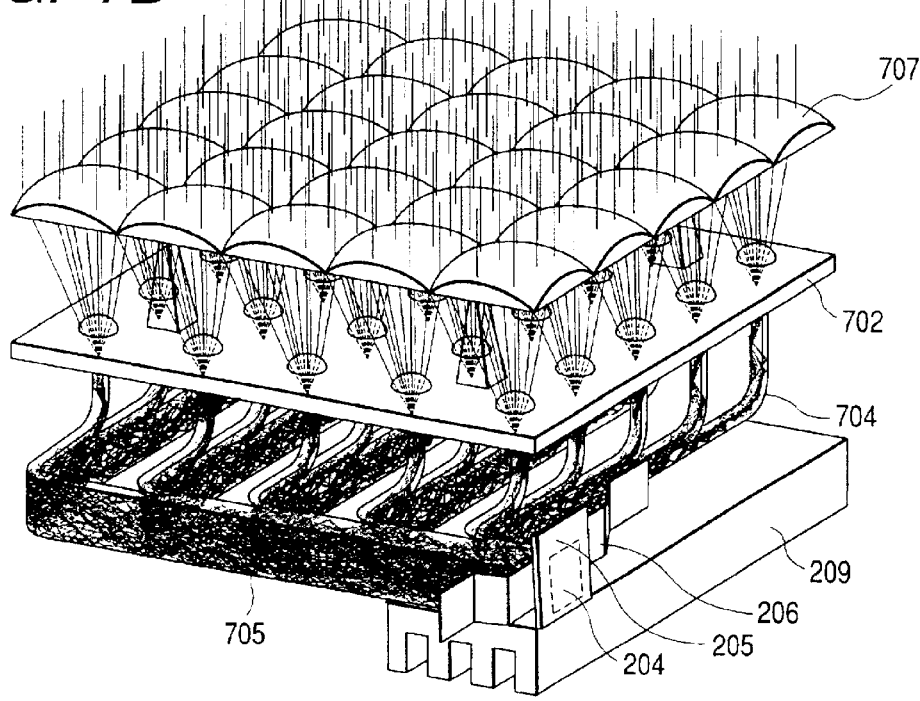

FIG. 6A is a sectional view of a concentrating photovoltaic module. FIG. 6B is an enlarged view of part C in the concentrating photovoltaic module shown in FIG. 6A. FIG. 6C shows the structure of the region near the solar cell. FIG. 7A is a perspective view showing the structure of the concentrating photovoltaic module. FIG. 7B shows incidence paths of sunbeams in the case where the solar radiation is made incident to the concentrating photovoltaic module shown in FIG. 7A.

In Example 1 the trunk of the lightguide member extended depthwise (in the direction of the normal to the concentrating optical elements), whereas the present example is an example wherein the trunk 705 of the lightguide member 703 is extended in the parallel direction to the concentrating optical elements 701 and wherein the lightguide member 703 is laid out by effectively utilizing the interior of the three-dimensional space inside the concentrating photovoltaic module, thereby achieving further compactification of the concentrating photovoltaic module.

A specific configuration will be described below.

Aspherical lenses convex on the concentrating optical element side are provided at the entrance faces of the lightguide member 703, as in Example 2. Each of the branches 704 of the lightguide member 703 is bent by 90° so that the trunk 705 becomes parallel to the concentrating optical elements 701. The trunk and the bent portions of the branches are shaped so as not to hinder the total reflection of the sunbeams contributing to the power generation of the solar cell among the sunbeams traveling toward the solar cell inside the lightguide member and so as to prevent the return of the sunbeams entering the entrance faces of the lightguide member, to the entrance faces.

Positioning bars 803 are provided at four positions on the concentrating optical element side of the lightguide member 703 and recesses 405 fitting with the positioning bars 803 are provided at four positions on the nonphotoreceptive side of the concentrating optical element group.

Since the concentrating photovoltaic module constructed as described above permits the lightguide member to be set in various layouts making effective use of the interior of the three-dimensional space inside the concentrating photovoltaic module, it becomes feasible to achieve further compactification (thickness reduction) of the concentrating photovoltaic module. Since the concentrating optical element group is mechanically secured directly to the lightguide member, there is no need for the time for alignment of the optical axes and it is thus feasible to provide the inexpensive concentrating photovoltaic module with higher accuracy.

EXAMPLE 4

Figure 8:
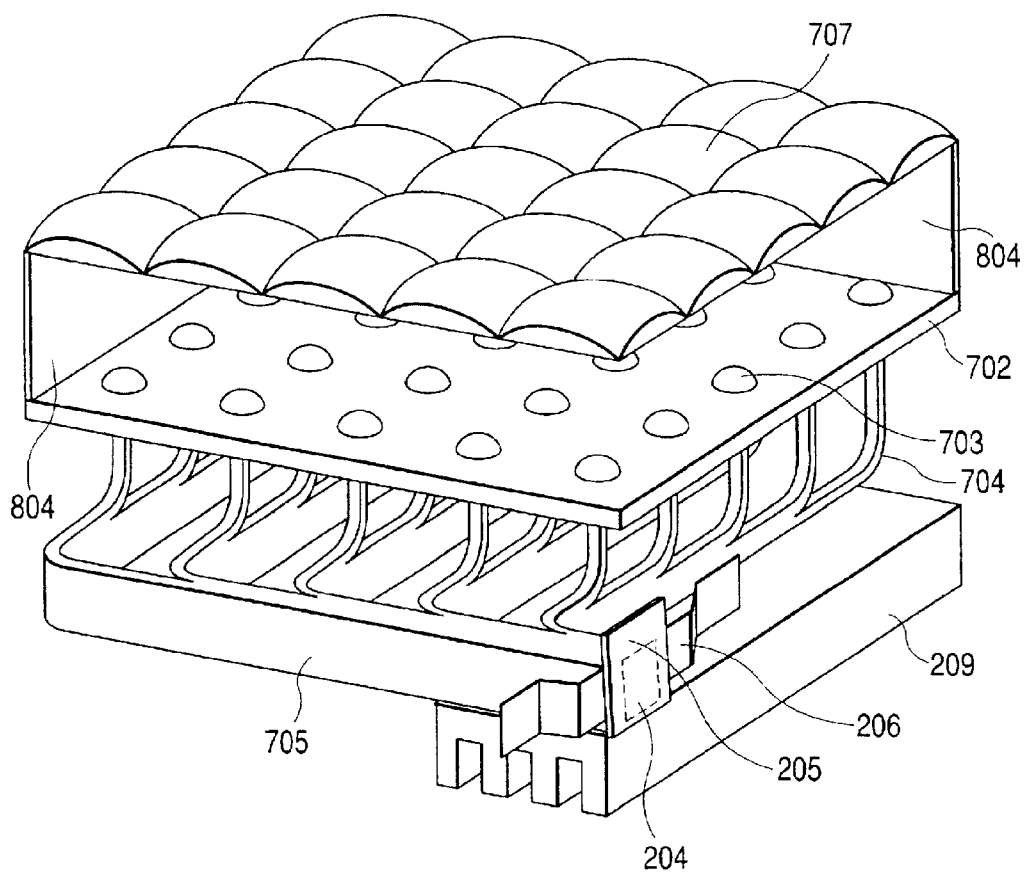
FIG. 8 is a view illustrating the fourth example of the present invention, which is a perspective view showing the structure of a concentrating photovoltaic module.

FIG. 8 shows the fourth example of the present invention.

FIG. 8 is a perspective view showing the structure of a concentrating photovoltaic module.

The present example is different from Example 3 in that the concentrating optical element group 707 and the lightguide member 703 are integrally formed through a support plate 804 and the concentrating optical elements and in that the lightguide member are made by single injection molding.

This configuration permits the concentrating optical elements and the lightguide member to be produced at low cost and obviates the need for the alignment of the optical axes between the concentrating optical elements and the lightguide member, thereby making it feasible to provide the concentrating solar cell with higher accuracy.

As described above, the present invention provides the following effects.

A concentrating photovoltaic module according to the present invention is a concentrating photovoltaic module comprising: a lightguide member having at least one exit face and a plurality of entrance faces; and at least one solar cell positioned immediately after the exit face of the lightguide member; wherein the lightguide member is comprised of a light transmissive, solid medium having no refractive-index-discontinuity portion and a surface of the lightguide member is smooth, and wherein the lightguide member makes sunbeams incident on the plurality of entrance faces, totally reflected on side faces, and emergent from the exit face. This enabled the sunbeams with different characteristics (light quantity and spectral distributions) incident on all the entrance faces in the concentrating photovoltaic module to be combined and to be guided in the reduced state of light quantity unevenness and spectral distribution dispersion to the solar cell with high efficiency.

Since the permissible incidence angle range of the entrance faces of the lightguide member was increased, it resulted in relieving the tracking accuracy of the tracking device, relieving the forming accuracy of the concentrating photovoltaic module, making effective use of the circumsolar radiation, etc., which enhanced the power generation efficiency of the concentrating photovoltaic module.

Further, it is preferable in the present invention to employ the structure wherein the module has the concentrating optical element group comprising the plurality of concentrating optical elements paired up with the entrance faces and functioning to concentrate the sunbeams from the sun in the vicinity of the entrance faces and wherein the sunbeams concentrated by the concentrating optical elements are made incident on the entrance faces of the lightguide member, totally reflected on the side faces, and emergent from the exit face. This structure has permitted more sunbeams to be guided to the entrance faces of the lightguide member, which resulted in providing the concentrating photovoltaic module with the higher concentrating magnification.

Since the sunbeams are concentrated by the plurality of concentrating optical elements for one solar cell, the size of the concentrating optical elements becomes smaller and the focal length becomes shorter even in the case of use of the concentrating optical elements having the same F-number as that in the conventional concentrating photovoltaic modules, which achieves great compactification of the concentrating photovoltaic module. The size of one concentrating optical element becomes much smaller than that in the conventional concentrating photovoltaic modules (one concentrating optical element for one solar cell), and as a result it becomes feasible to use the planoconvex lenses, which were hard to use in terms of the weight, cost, size, and formability in the conventional concentrating photovoltaic modules. This also achieved the enhancement of the power generation efficiency of the concentrating photovoltaic module.

The lightguide member is preferably comprised of a uniform medium. This made it feasible to make the lightguide member by integral molding or the like, which decreased the cost. Since the coefficient of linear expansion was made uniform in the lightguide member, the lightguide member became more resistant to mechanical influence due to temperature difference.

It is also preferable to employ the structure wherein the lightguide member consists of the trunk and the plurality of branches extending from the trunk, the lightguide member has the exit face at the root of the trunk and the entrance faces at the distal ends of the branches, and the sunbeams entering the entrance faces are mixed in the branches and trunk and thereafter guided to the solar cell. This structure has permitted the lightguide member to be arranged in various layouts making effective use of the interior of the three-dimensional space inside the concentrating photovoltaic module, thereby achieving further compactification of the concentrating photovoltaic module.

The shape of the lightguide member is preferably one not hindering the total reflection of the sunbeams traveling toward the solar cell inside the lightguide member. This has permitted the sunbeams entering the entrance faces of the lightguide member to be guided to the exit face with high efficiency.

The shape of the exit face of the lightguide member is preferably substantially the same as that of the solar cell. This has permitted the sunbeams emerging from the exit face of the lightguide member to be guided efficiently to the solar cell.

It is also preferable to employ the configuration wherein the solar cell is mounted parallel to the exit face. This has permitted the sunbeams emerging from the exit face of the lightguide member to be guided most efficiently to the solar cell.

The shape of the lightguide member immediately before the exit face is preferably the tapered shape toward the exit face. This has permitted the sunbeams to be concentrated in the state of the shortest path lengths in the lightguide member and suppressed the energy loss due to the internal transmittance in the lightguide member.

The sectional shape of the trunk or the branches of the lightguide member is preferably rectangular. This has permitted the lightguide member to be excellent in the mixing of sunbeams, formability, designing of the merge shape of the branches, and designing of the merge shape of the branches and trunk.

The concentrating optical elements are preferably the planoconvex lenses convex on the photoreceptive surface side. This has permitted the concentrating optical elements to have the high optical efficiency and the small spherical aberration and coma, which resulted in expanding the permissible incidence angle range of the concentrating photovoltaic module (relieving the tracking accuracy of the tracking device, relieving the forming accuracy of the concentrating photovoltaic module, making effective use of the circumsolar radiation, etc.) and, as a result, achieving the enhancement of the power generation efficiency of the concentrating photovoltaic module.

Each planoconvex lens is preferably one with an aspherical surface. This eliminated the spherical aberration of the concentrating optical elements and achieved further enhancement of the power generation efficiency of the concentrating photovoltaic module.

It is also preferable to employ the structure wherein the entrance faces of the lightguide member are spherical surfaces or aspherical surfaces convex on the photoreceptive surface side. This has permitted even the sunbeams arriving with deviation at the entrance faces of the lightguide member to be also guided to the lightguide member. Namely, even if the sunbeams should arrive with deviation at the entrance faces of the lightguide member because of the aberration of the concentrating optical elements, the tracking errors of the tracking device, and the forming errors of the concentrating photovoltaic module, the sunbeams would be able to be again concentrated on the entrance faces of the lightguide member by the concentrating effect of the entrance faces of the lightguide member. Further, it also became feasible to guide even the circumsolar radiation to the solar cell, which resulted in enhancing the power generation efficiency of the concentrating photovoltaic module.

It is also preferable to employ the structure wherein the concentrating optical elements are optical systems having their respective focal points approximately in the vicinity of the entrance faces of the lightguide member and the lightguide member is held in the vicinity of the focal points. This made the areas without occurrence of the total reflection of sunbeams on the side faces of the lightguide member near the focal points. When the lightguide member was held at the areas, the lightguide member was able to be firmly held only at those portions, without hindering the total reflection of the sunbeams in the lightguide member.

Namely, if the lightguide member were held at portions where the sunbeams are totally reflected on the side faces of the lightguide member, the total reflection would not occur there, resulting in energy loss.

It is also preferable to employ the structure wherein the concentrating optical element group is made by integral molding. This has permitted the concentrating optical element group to be produced at low cost, and enabled the optical axes of all the concentrating optical elements to be aligned at a time in assembly of the concentrating photovoltaic module.

It is also preferable to employ the structure wherein the lightguide member is made by integral molding. This has permitted the lightguide member to be produced at low cost and also enabled the optical axes of all the concentrating optical elements to be aligned at a time in assembly of the concentrating photovoltaic module.

It is also preferable to employ the structure wherein the concentrating optical element group and the lightguide member are made by integral molding. This has permitted the concentrating optical elements and the lightguide member to be produced at low cost and also obviated the necessity for the alignment of the optical axes between the concentrating optical elements and the lightguide member, thereby providing the inexpensive concentrating photovoltaic module with higher accuracy.

It is also preferable to employ the configuration wherein the light transmissive member with light transmitting property is placed between the lightguide member and the solar cell and the refractive index of the light transmissive member is larger than that of the lightguide member. This has permitted the sunbeams to be guided efficiently to the solar cell while suppressing the reflection loss of the sunbeams having traveled in the lightguide member, upon emergence from the exit face of the lightguide member.

It is also preferable to employ the configuration wherein the exit face of the lightguide member is kept in close contact with the solar cell. While the refractive index of the surface layer, if provided, placed on the surface of the solar cell is 2 to 3, the refractive index of glass, resin, or the like used as the lightguide member is as low as 1.4 to 1.9. Therefore, the foregoing configuration has permitted the sunbeams having traveled in the lightguide member to be guided more efficiently to the solar cell.

It is also preferable to employ the structure wherein the lightguide member has the reflecting films at the lightguide-holding portions. Even in the case where the sunbeams concentrated by the concentrating optical elements were incident with deviation from the centers of the entrance faces of the lightguide member because of the assembly errors or the tracking errors of the concentrating photovoltaic module of the present invention, so as to reach the portions where the lightguide member was held, the aforementioned structure has permitted the sunbeams to be reflected by the reflecting films, which minimized the loss at the lightguide-holding portions.

It is also preferable to provide the protective layer in the form covering the side faces of the lightguide member and in the state of no contact with the side faces of the lightguide member. This prevented the trouble of decrease in reflectance on the side faces due to the deposition of dust or contamination on the side faces of the lightguide member under long-term use and enabled to maintain the performance of the lightguide member over a long period of time.

By combining the aforementioned concentrating photovoltaic module with the sun tracking device, it became feasible to provide the tracking type concentrating photovoltaic power generating system provided with the inexpensive, compact concentrating photovoltaic module for efficiently concentrating the sunbeams on the solar cell, without light quantity unevenness and spectral distribution dispersion. Since the concentrating photovoltaic module was constructed in compact size, it became feasible to reduce the cost of the sun tracking device from the aspects of wind resistance and weight.

What is claimed is:

1. A concentrating photovoltaic module comprising:
   a lightguide member having at least one exit face and a plurality of entrance faces; and
   at least one solar cell placed immediately after the exit face of the lightguide member;
   wherein the lightguide member is comprised of a light transmissive, solid medium having no refractive-index-discontinuity portion and a surface of the lightguide member is smooth, and
   wherein the lightguide member makes sunbeams incident on the plurality of entrance faces, totally reflected on side faces, and emergent from the exit face.

2. The module according to claim 1, further comprising a concentrating optical element group comprising a plurality of concentrating optical elements being in a pair with the plurality of entrance surfaces of the lightguide member and adapted to concentrate the sunbeams in the vicinity of the respective entrance faces,
   wherein the lightguide member makes the sunbeams concentrated by the plurality of concentrating optical elements, incident on the plurality of entrance faces, totally reflected on the side faces, and emergent from the exit face.

3. The module according to claim 1, wherein the lightguide member is comprised of a uniform medium.

4. The module according to claim 1, wherein the lightguide member consists of a trunk and a plurality of branches diverging from the trunk, the trunk has the exit face at an end thereof, the plurality of branches have the plurality of entrance faces at ends thereof, and the sunbeams incident on the plurality of entrance faces are mixed in the trunk and the plurality of branches and thereafter guided to the solar cell.

5. The module according to claim 1, wherein a shape of the lightguide member is a shape not hindering total reflection of sunbeams traveling toward the solar cell inside the lightguide member.

6. The module according to claim 1, wherein a shape of the exit face of the lightguide member is substantially the same as a shape of the solar cell.

7. The module according to claim 1, wherein the solar cell is mounted parallel to the exit face.

8. The module according to claim 1, wherein a portion of the lightguide member immediately before the exit face is tapered toward the exit face.

9. The module according to claim 4, wherein a sectional shape of at least either of the trunk and the branches of the lightguide member is rectangular.

10. The module according to claim 2, wherein each of the plurality of concentrating optical elements is a planoconvex lens convex on the photoreceptive surface side.

11. The module according to claim 10, wherein the planoconvex lens comprises an aspherical surface.

12. The module according to claim 1, wherein a shape of the plurality of entrance faces of the lightguide member is a spherical surface or an aspherical surface convex on the photoreceptive surface side.

13. The module according to claim 2, wherein the lightguide member is held in the vicinity of focal points of the plurality of concentrating optical elements.

14. The module according to claim 2, wherein the concentrating optical element group is made by integral molding.

15. The module according to claim 1, wherein the lightguide member is made by integral molding.

16. The module according to claim 2, wherein the concentrating optical element group and the lightguide member are made by integral molding.

17. The module according to claim 1, further comprising a light transmissive member with a light transmitting property between the exit face of the lightguide member and the solar cell, wherein a refractive index of the light transmissive member is larger than a refractive index of the lightguide member.

18. The module according to claim 1, wherein the exit face of the lightguide member is in close contact with the solar cell.

19. The module according to claim 1, wherein the lightguide member has reflecting films at portions where the lightguide member is held.

20. The module according to claim 1, wherein the lightguide member has a protective layer in a form covering the side faces and in a state of no contact with the side faces.

21. A concentrating photovoltaic power generating system, comprising the concentrating photovoltaic module as set forth in claim 1, and a sun tracking device.

* * * * *

UNITED STATES PATENT AND TRADEMARK OFFICE
CERTIFICATE OF CORRECTION

PATENT NO. : 6,730,840 B2  Page 1 of 1
DATED : May 4, 2004
INVENTOR(S) : Makoto Sasaoka et al.

It is certified that error appears in the above-identified patent and that said Letters Patent is hereby corrected as shown below:

Column 20,
Line 28, "(about 250)÷the" should read -- (about 250)×the --.

Signed and Sealed this

Fourth Day of January, 2005

JON W. DUDAS
*Director of the United States Patent and Trademark Office*